United States Patent
Kondou

(10) Patent No.: US 6,523,160 B2
(45) Date of Patent: Feb. 18, 2003

(54) METHOD FOR DIVIDING A TERMINAL IN AUTOMATIC INTERCONNECT ROUTING PROCESSING, A COMPUTER PROGRAM FOR IMPLEMENTING SAME, AND AN AUTOMATIC INTERCONNECT ROUTING PROCESSOR USING THE METHOD

(75) Inventor: Keiichirou Kondou, Kanagawa (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/833,554

(22) Filed: Apr. 13, 2001

(65) Prior Publication Data

US 2002/0026625 A1 Feb. 28, 2002

(30) Foreign Application Priority Data

Apr. 17, 2000 (JP) ........................................ 2000-115738

(51) Int. Cl.[7] ............................................... G06F 17/50
(52) U.S. Cl. .......................................... 716/12; 716/11
(58) Field of Search ............................. 716/12, 15, 11; 365/63; 307/147

(56) References Cited

U.S. PATENT DOCUMENTS 4,752,887 A * 6/1988 Kuwahara .................... 716/15
5,483,481 A * 1/1996 Hizume et al. ............... 716/12
5,757,089 A * 5/1998 Ishizuka ....................... 716/12

FOREIGN PATENT DOCUMENTS

JP 6-291188 10/1994
JP 10-294377 11/1998

OTHER PUBLICATIONS

Kodowaki, "Automatic Wiring System dor Semoconductor Integrated Circuit (English Translation)", Japanese Patent No. 06291188, Oct. 1994, Japan Patent Office.*

* cited by examiner

Primary Examiner—Matthew Smith
Assistant Examiner—Sun James Lin
(74) Attorney, Agent, or Firm—McGinn & Gibb, PLLC

(57) ABSTRACT

In a method for dividing a terminal into a plurality of terminal units in automatic interconnect routing processing in a semiconductor device, a terminal portion, which is a part of the terminal, overlapped an intersection of the wiring grids in X-direction and Y-direction is extracted. A terminal region which includes the terminal portion is surrounded with a top side, a bottom side, a left side and a right side of the terminal region. These sides are moved outward so as to expand the terminal region, respectively, thereby dividing the terminal into a plurality of terminal regions.

18 Claims, 20 Drawing Sheets

METHOD FOR DIVIDING A TERMINAL IN AUTOMATIC INTERCONNECT ROUTING PROCESSING, A COMPUTER PROGRAM FOR IMPLEMENTING SAME, AND AN AUTOMATIC INTERCONNECT ROUTING PROCESSOR USING THE METHOD

BACKGROUND OF THE INVENTION

1. Field of the Invention

The present invention relates to a method for dividing a terminal in automatic interconnect routing processing for a semiconductor device, to a computer program for implementing that method, and to an automatic interconnect routing processor using this method. More particularly, it relates to a method for dividing functional block terminals suitable for the case in which a functional block terminal used in automatic interconnect routing straddles across a plurality of interconnect intersections of wiring grids.

2. Related Art

In conventional automatic interconnect routing processing as shown in FIG. 17, in the case in which a functional block terminal 100 straddles across a plurality of interconnect intersections of wiring grids (the five locations A, B, C, D, and E are shown in FIG. 17) in performing automatic interconnect routing processing, there is the problem that the functional block terminal 100 are used as part of the automatic interconnects.

For example, in the case in which a plurality of inverters INV1 to INVn are connected in parallel, when a wiring of an INV2 is made via terminal E, because it is not possible to determine the capacitance and resistance of the input terminal of the INV2, it is not possible to accurately perform the timing verification. For this reason, although no problem will occur in the timing verification, there is a timing problem occurring in the actual product.

For solving this problem in the prior art, a functional block terminal is defined as terminal rectangle area that includes one wiring grid. In this case, when one terminal is used, there was the problem of not being able to use the above-mentioned terminals again.

As shown in FIG. 18, in the case in which there is a terminal F on a wiring grid and an interconnect G is connected to the terminal F, an interconnect prohibition area is defined by providing the interconnect G, so that an interconnect H is connected to the terminal F, while making contact with the interconnect G.

In this case, because an interconnect prohibition area is defined and there is contact between interconnect H and the interconnect G, so that an error occurring in performing automatic interconnect routing is detected. Therefore, the interconnect H is not connected to the terminal F by the automatic interconnect routing processing.

Accordingly, it is an object of the present invention to eliminate setting errors and the like in an automatic interconnect routing processing, so as to perform automatic interconnect routing processing with high good efficiency.

SUMMARY OF THE INVENTION

To achieve the above-noted objects, the present invention adopts the following base technical constitution.

Specifically, a first aspect of the present invention is a method for dividing a terminal into a plurality of terminal units in automatic interconnect routing processing in a semiconductor device, the method comprising the steps of: reading in functional block layout information of the semiconductor device from an external memory device, separating the functional block layout information into input/output terminal information, non-input/output terminal information, and wiring grid information for wiring grids, and storing the input/output terminal information, the non-input/output terminal information, and the wiring grid information in an internal memory device, recalling wiring grid information stored in the internal memory device, setting auxiliary wiring grids at an intermediate point between the wiring grids adjacently arranged to each other in the X direction and at an intermediate point between the wiring grids adjacently arranged to each other in Y direction, and storing the auxiliary wiring grid information including the auxiliary wiring grids in the internal memory device, recalling the input/output terminal information and the auxiliary wiring grids information stored in the internal memory device, and overlapping the terminal and the auxiliary wiring grids, dividing a wiring area of the semiconductor device into a first region and a second region wherein the first region is an area formed by being surrounded with the auxiliary wiring grids adjacently arranged to each other in X-direction and being adjacently arranged to each other in Y-direction and including the terminal provided on a crossing point at which the auxiliary wiring grid in X-direction and in Y-direction are intercrossed to each other and the second region which does no include the terminal over the crossing point so as to define a top side, a bottom side, a left side and a right side of the first region, moving the top, bottom, left, and right sides of the first region outward so as to expand the first region, respectively, until each side comes into contact with or overlaps an adjacent first region, and dividing the terminal into a plurality of first regions expanded by moving the sides, and storing the dividing information as the terminal units in the external memory device.

A second aspect of the present invention is a method for dividing a terminal into a plurality of terminal units in automatic interconnect routing processing in a semiconductor device, the method comprising the steps of: reading in functional block layout information of the semiconductor device from an external memory device, separating the functional block layout information into input/output terminal information, non-input/output terminal information, and wiring grid information for wiring grids, and storing the input/output terminal information, the non-input/output terminal information, and the wiring grid information in an internal memory device, recalling the input/output terminal information and the wiring grids information stored in the internal memory device, and overlapping the terminal and the wiring grids, extracting a terminal portion, which is a part of the terminal, overlapped an intersection of the wiring grids in X-direction and Y-direction, forming a terminal region which includes the terminal portion, and forming a top side, a bottom side, a left side and a right side so as to surround the terminal region, moving the top, bottom, left, and right sides of the terminal region outward so as to expand the terminal region, respectively, until each side comes into contact with or overlaps an adjacent terminal region, and dividing the terminal into a plurality of terminal regions expanded by moving the sides, and storing the dividing information as the terminal units in the external memory device.

DETAILED DESCRIPTION OF THE PREFERRED EMBODIMENTS

Embodiments of the present invention are described in detail below, with references made to relevant accompanying drawings.

First Embodiment

Figure 1A:
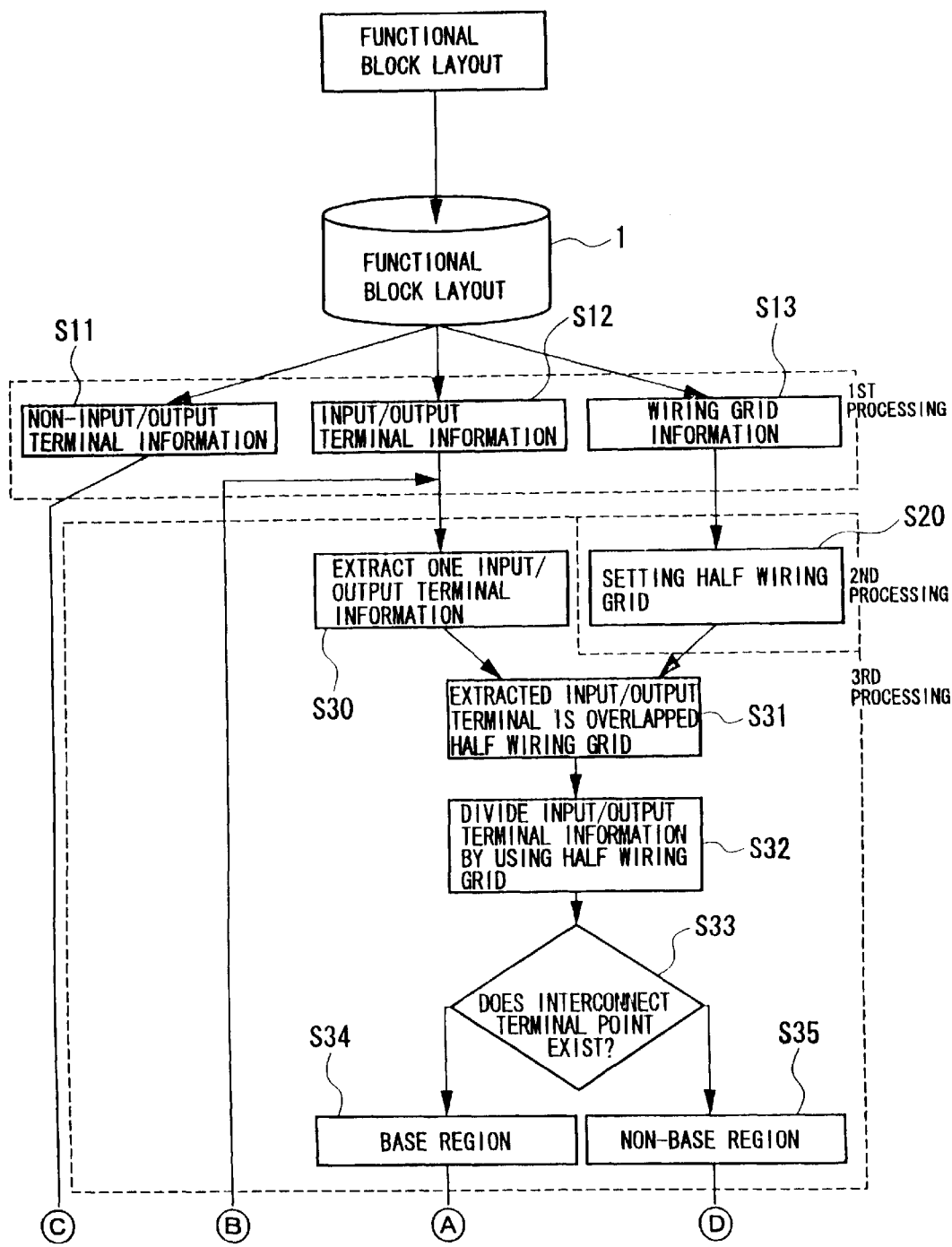
FIGS. 1(a) and 1(b) are flowcharts showing a first embodiment of the present invention.
Figure 1B:
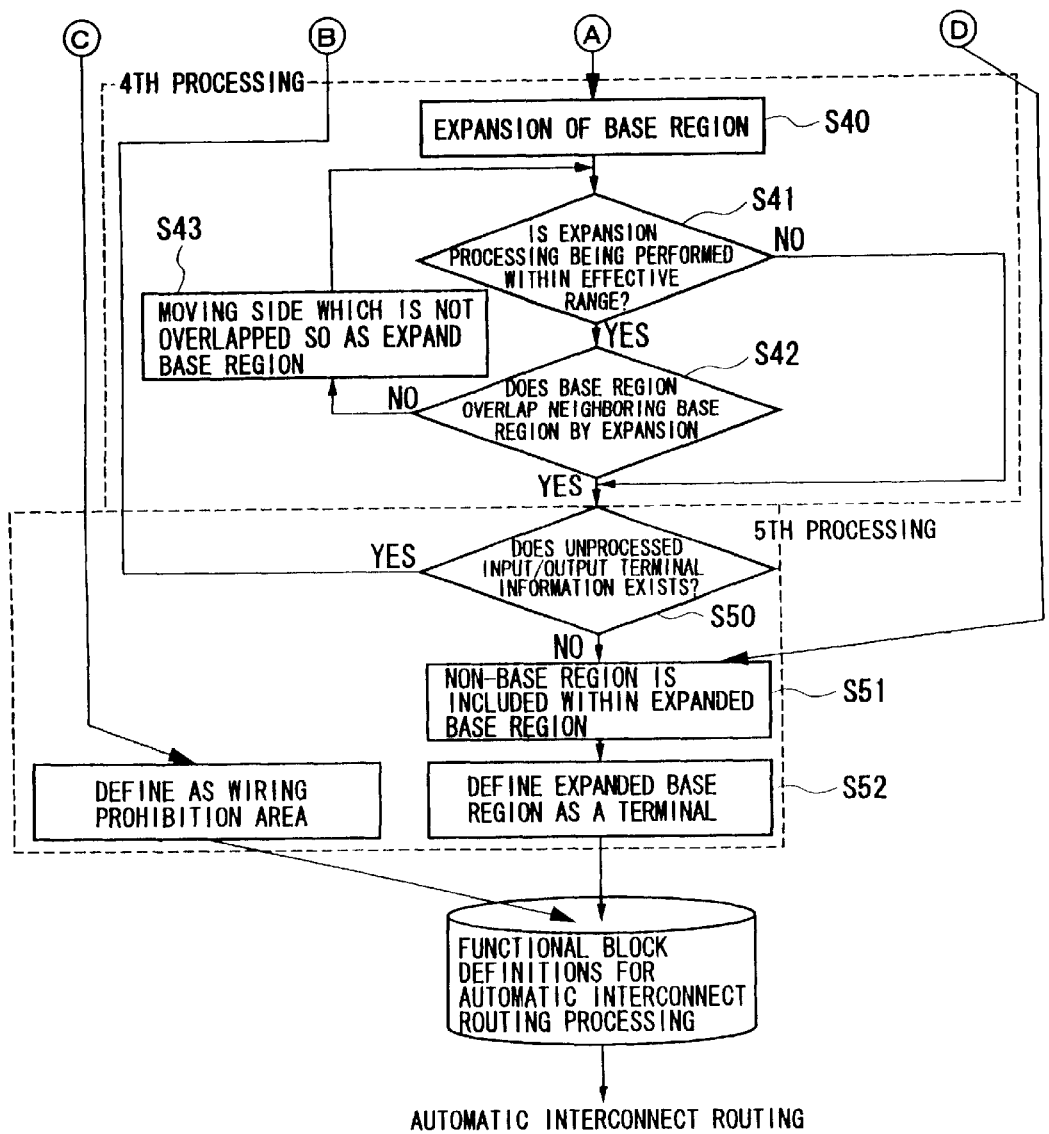
Figure 16:
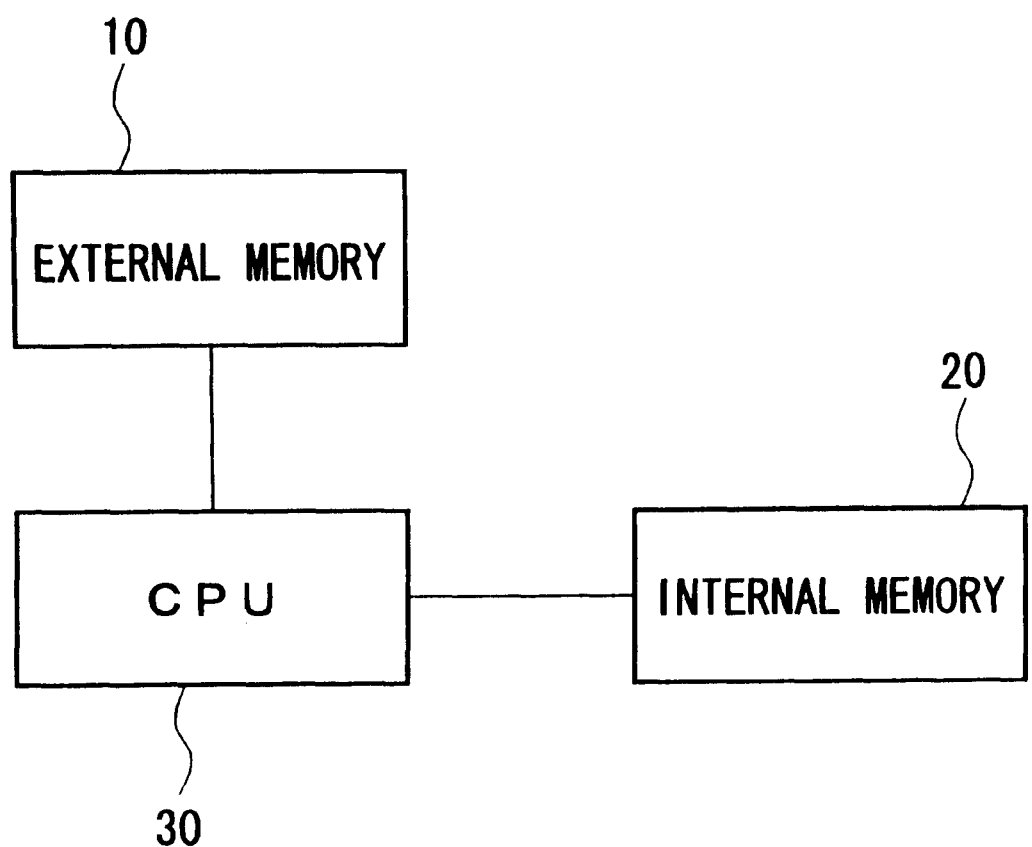
FIG. 16 is a block diagram showing a hardware of the present invention.
Figure 17:
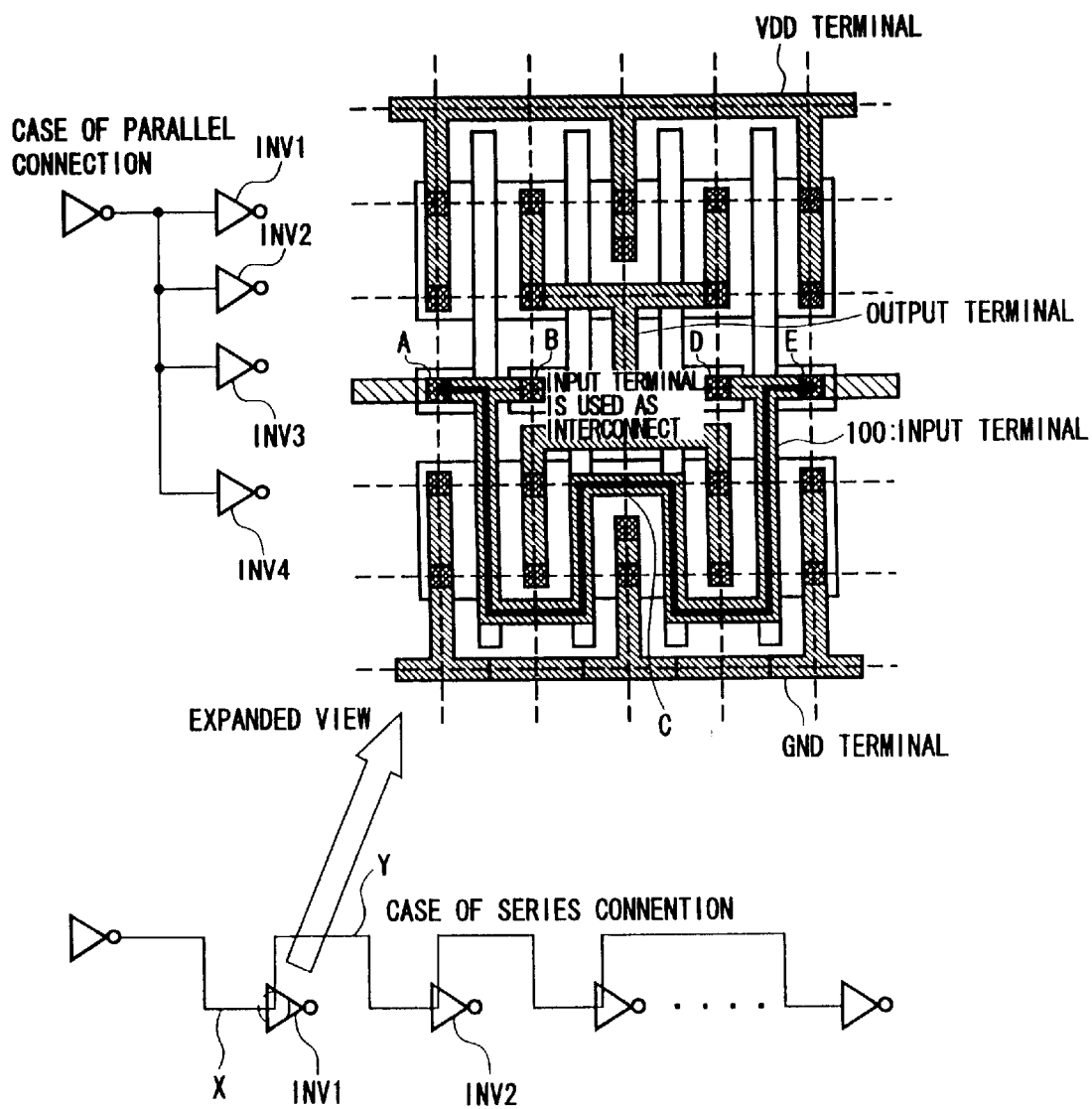
FIG. 17 is a drawing showing prior art.
Figure 18:
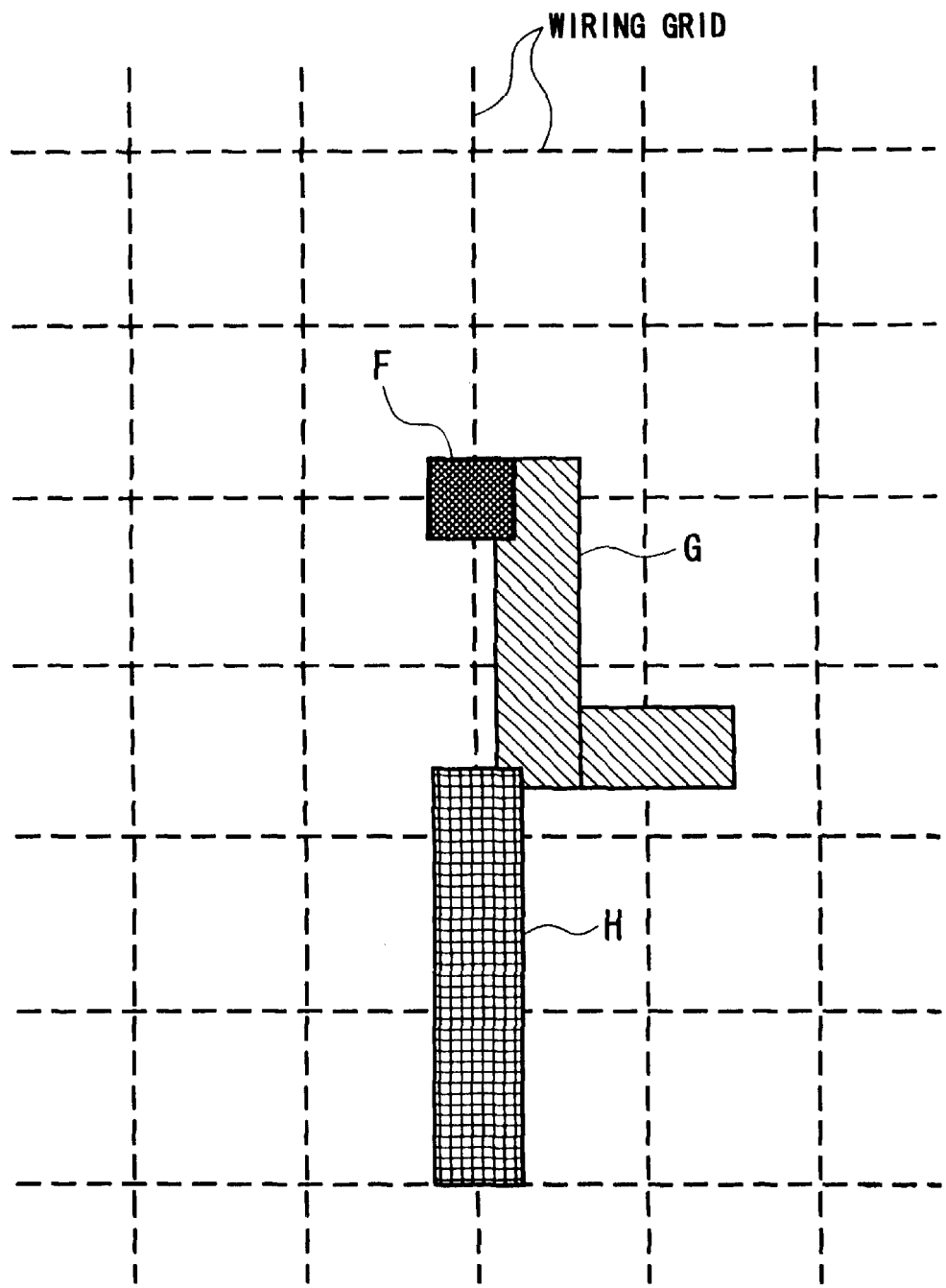
FIG. 18 is a drawing showing prior art.

FIG. 1 is a flowchart illustrating a method of the present invention, FIG. 16 is a block diagram of an automatic interconnect routing processor having an external memory device 10 and an internal memory device 20 and a CPU 30, with FIG. 2 to FIG. 10 being drawings illustrating the first embodiment.

The first embodiment is described below in detail.

Figure 2:
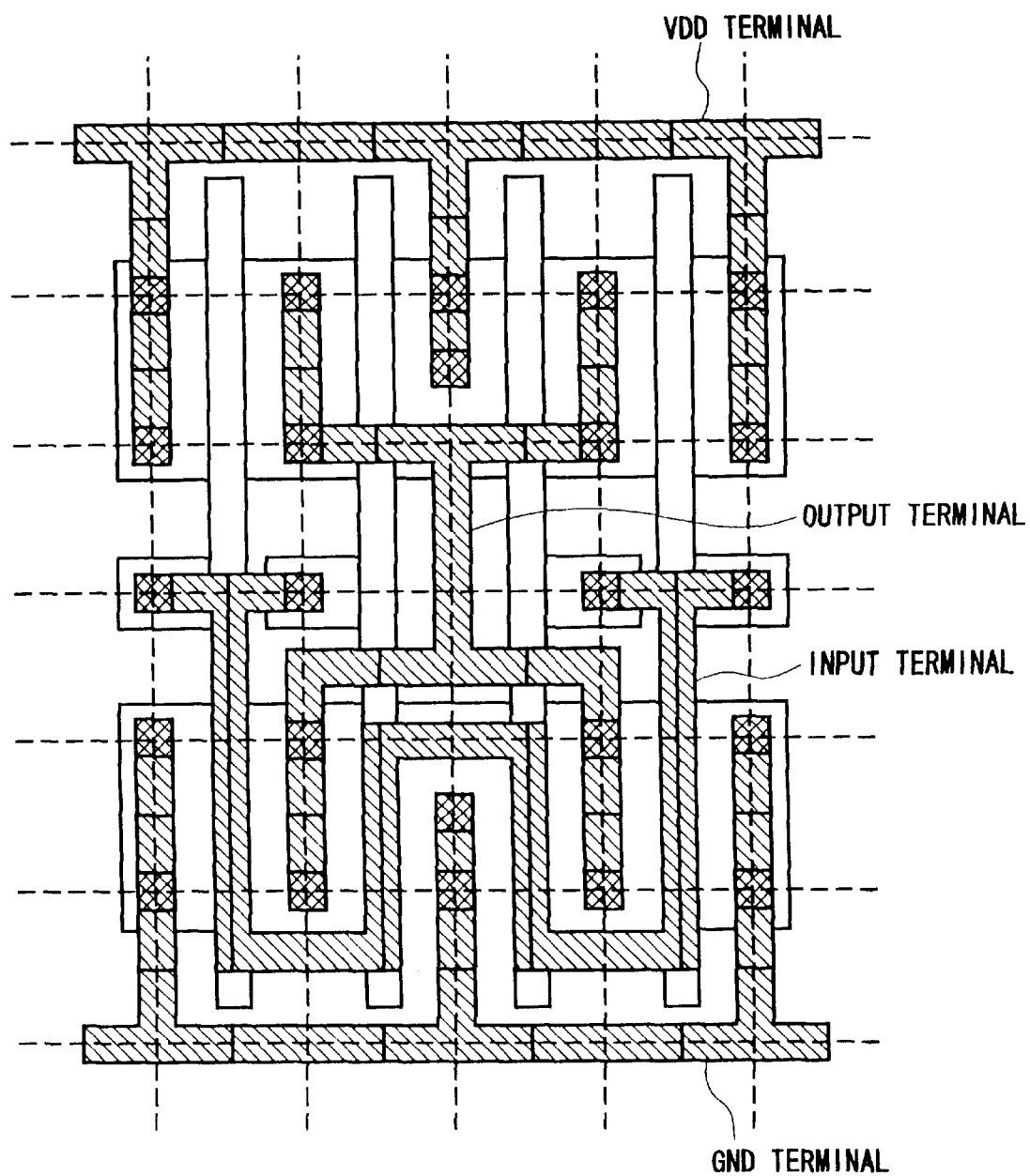
FIG. 2 is a drawing showing functional block layout information, which includes input/output terminal information, non-input/output terminal information, and wiring grid information.
Figure 3:
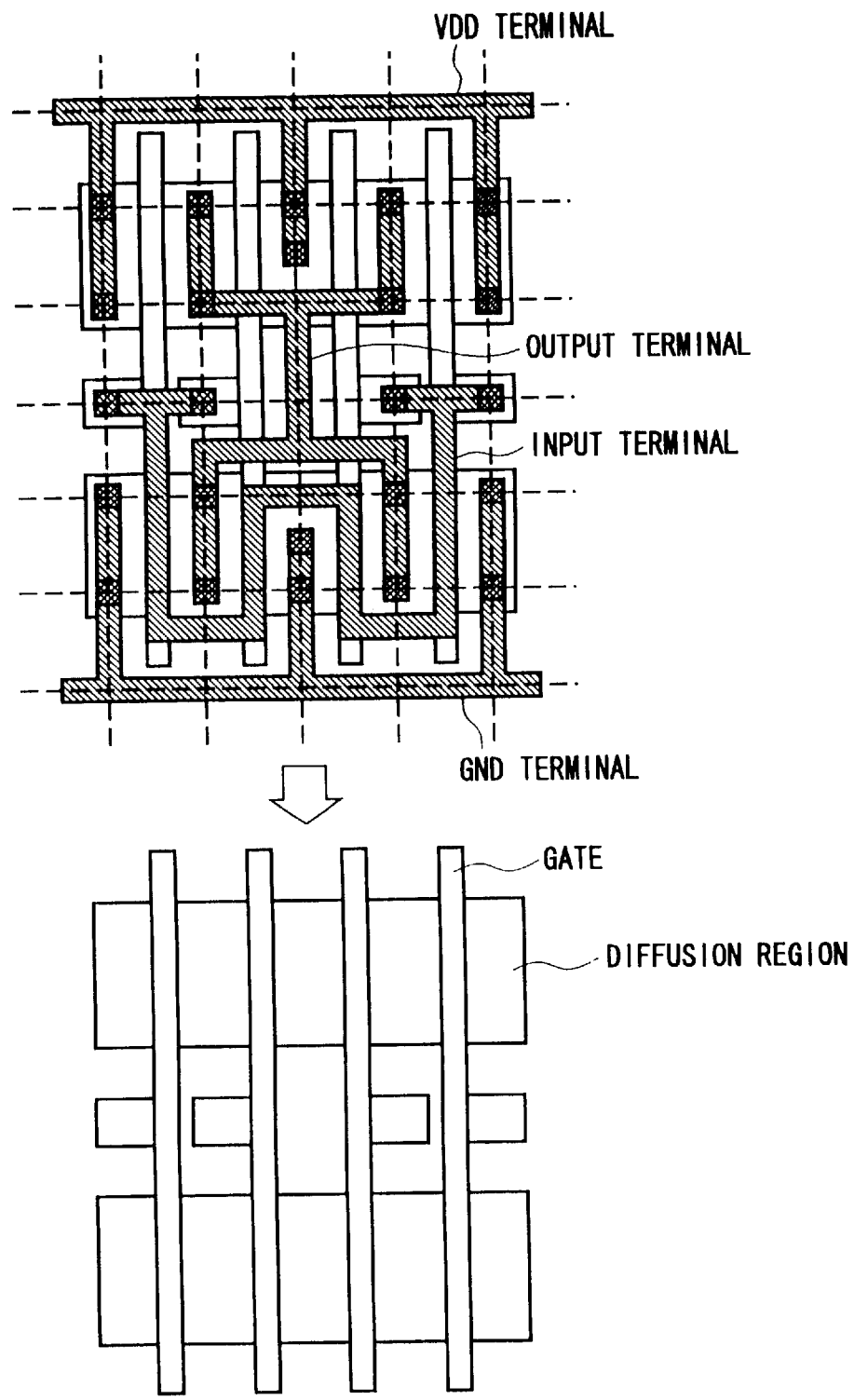
FIG. 3 is a drawing showing the condition in which non-input/output terminal information is separated from the functional block layout information.
Figure 4:
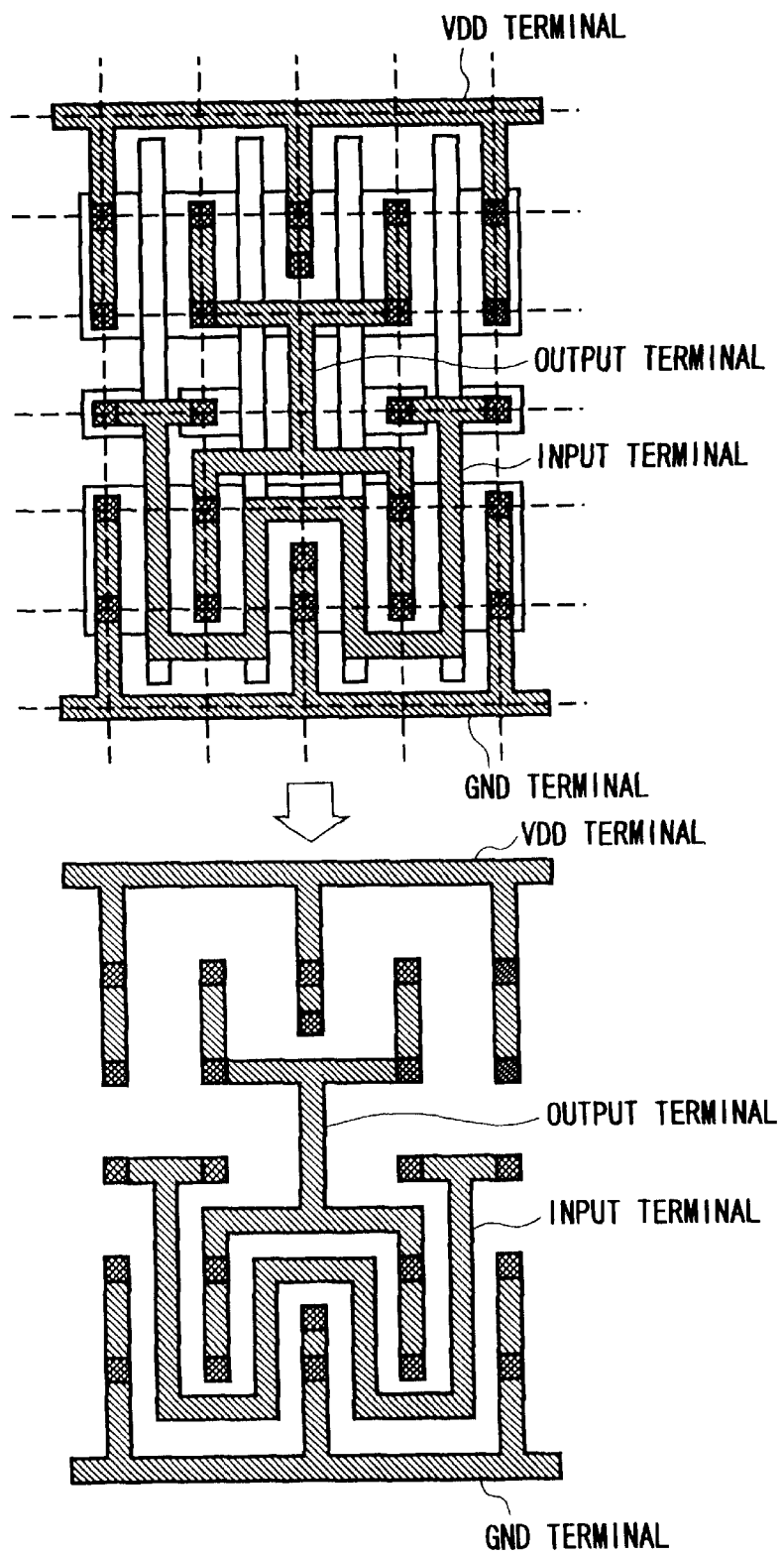
FIG. 4 is a drawing showing the condition in which input/output terminal information is separated from the functional block layout information.
Figure 5:
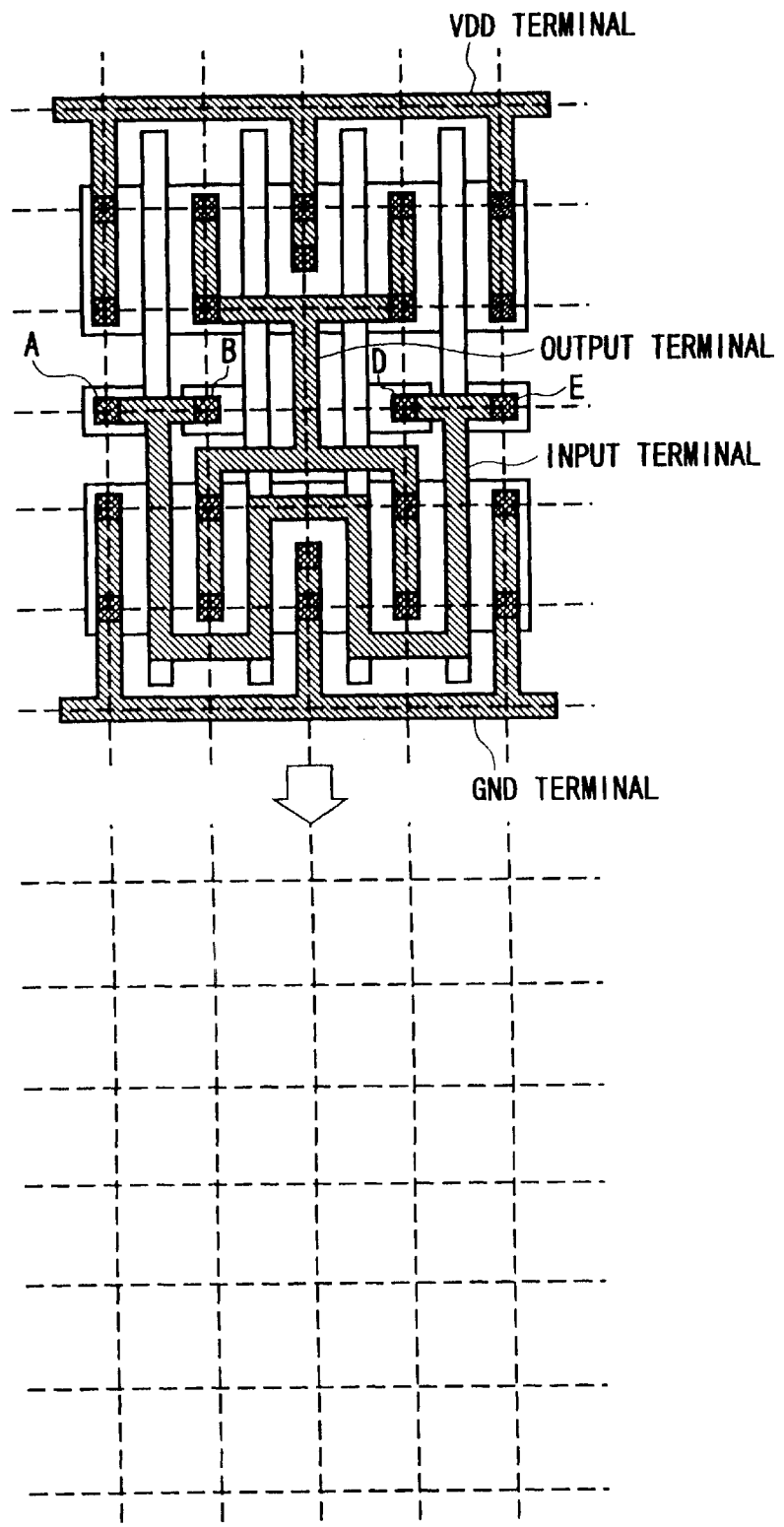
FIG. 5 is a drawing showing the condition in which wiring grid information is separated from the functional block layout information.

In the first processing, functional block layout information shown in FIG. 2 is read from an external memory device (not shown in the drawing), and this information is divided, as shown in FIG. 3 to FIG. 5, into input/output terminal information (FIG. 4), non-input/output terminal information (for example, information of the diffusion layer of the functional block, such as shown in FIG. 3), and wiring grid information (FIG. 5), and these divided data are stored in an internal memory device (Step S11, S12, S13).

Figure 6:
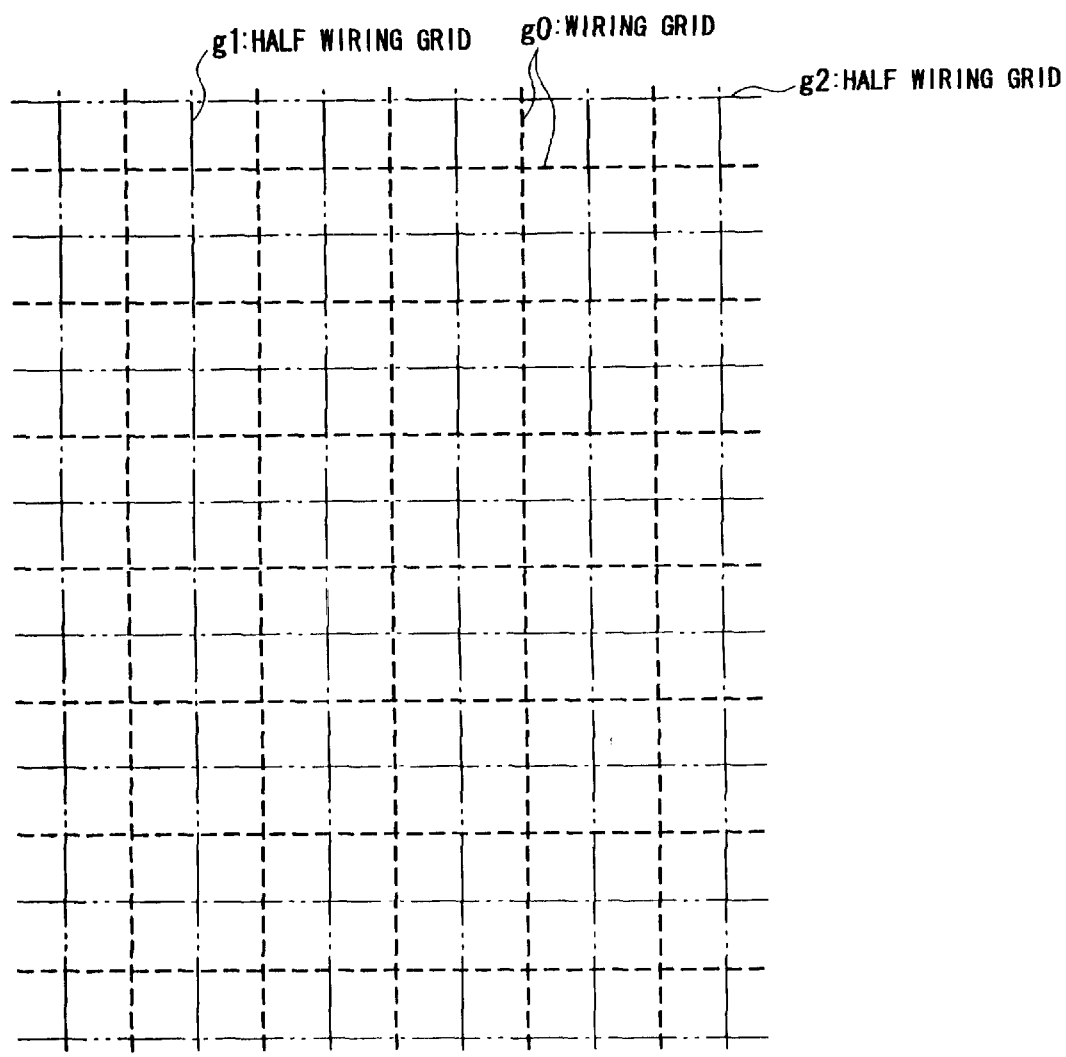
FIG. 6 is a drawing showing the condition in which half wiring grids are overlapped onto wiring grids.

In the second processing, wiring grid information stored in the internal memory device is recalled. Then, as shown in FIG. 6, a half wiring grid line g1 is set at exactly an intermediate point between neighboring wiring grids g0 in X direction. In the same manner, a half wiring grid line g2 is set for the Y-direction, and these information are stored in the internal memory device (Step S20).

Figure 7:
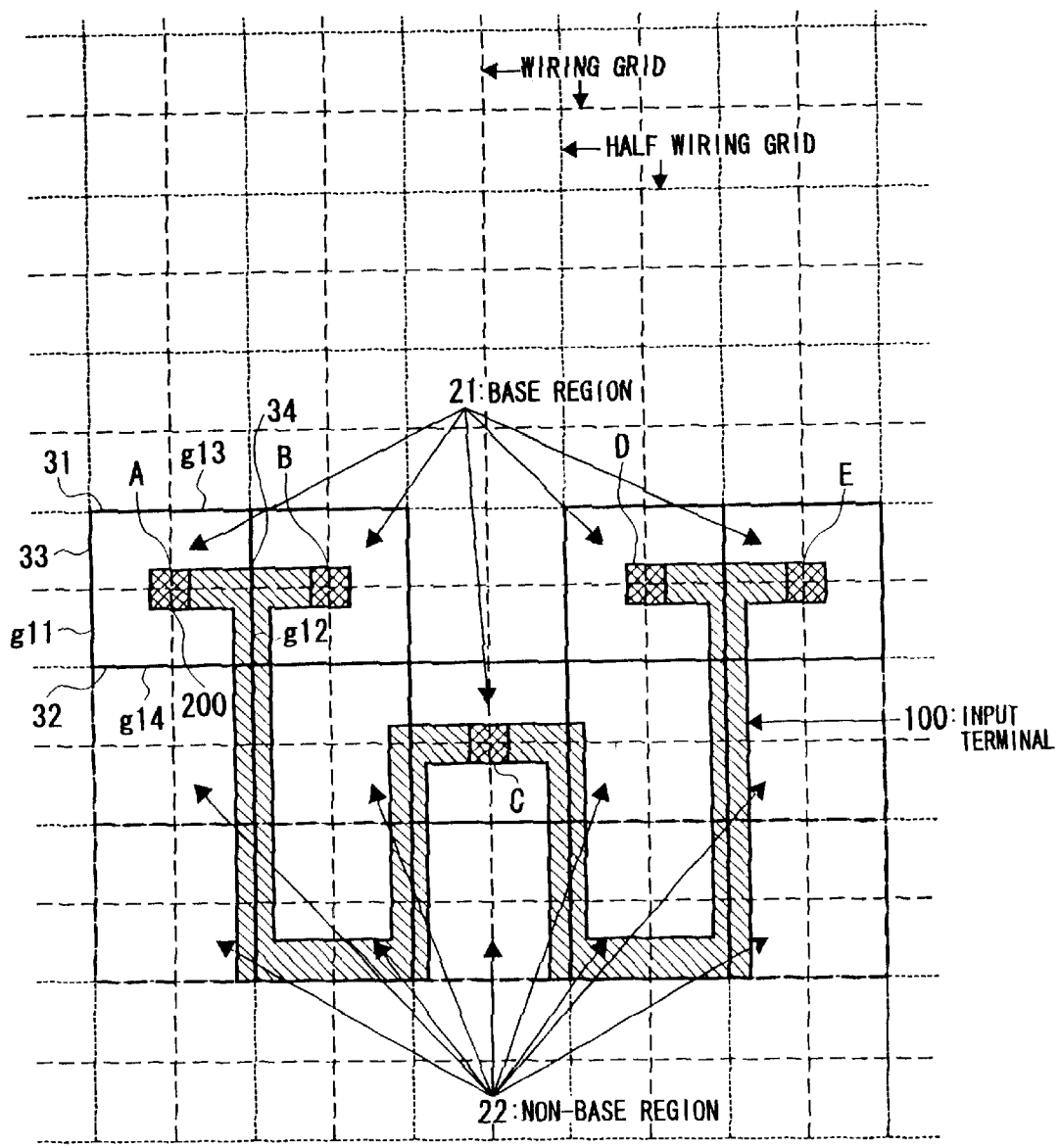
FIG. 7 is a drawing showing a base region and a region other than a base region.

In the third processing, as shown in FIG. 7, one terminal information (one input terminal information is shown in FIG. 7) and the half wiring grid set in the second processing are recalled from the internal memory device, and the terminal information is overlapped the wiring grid g0 (Step S30, S31).

The input/output terminal information is divided into a plurality of region units which are sandwiched by a half wiring grid line g11 and a neighboring half wiring grid line g12 in the Y-direction and a half wiring grid line g13 and a neighboring half wiring grid line g14 in the X-direction (Step S32). When this is done, there inevitably occurs a region which includes one interconnect terminal point which is a wiring overlapped on wiring grids g0, and a region which does not include such an interconnect terminal point. The regions which include interconnect terminal points A, B, C, D, and E in FIG. 7 are regions which can be automatically interconnected by an automatic interconnect processing method of the prior art, and the regions which do not include interconnect terminal point are regions that cannot be automatically interconnected.

Then, the region which includes an interconnect terminal point is defined as a base region (Step S33, S34), the regions in which there is no above-noted interconnect terminal point is defined as non-base region (Step S35), and these defined regions are stored into the internal memory device.

Figure 8:
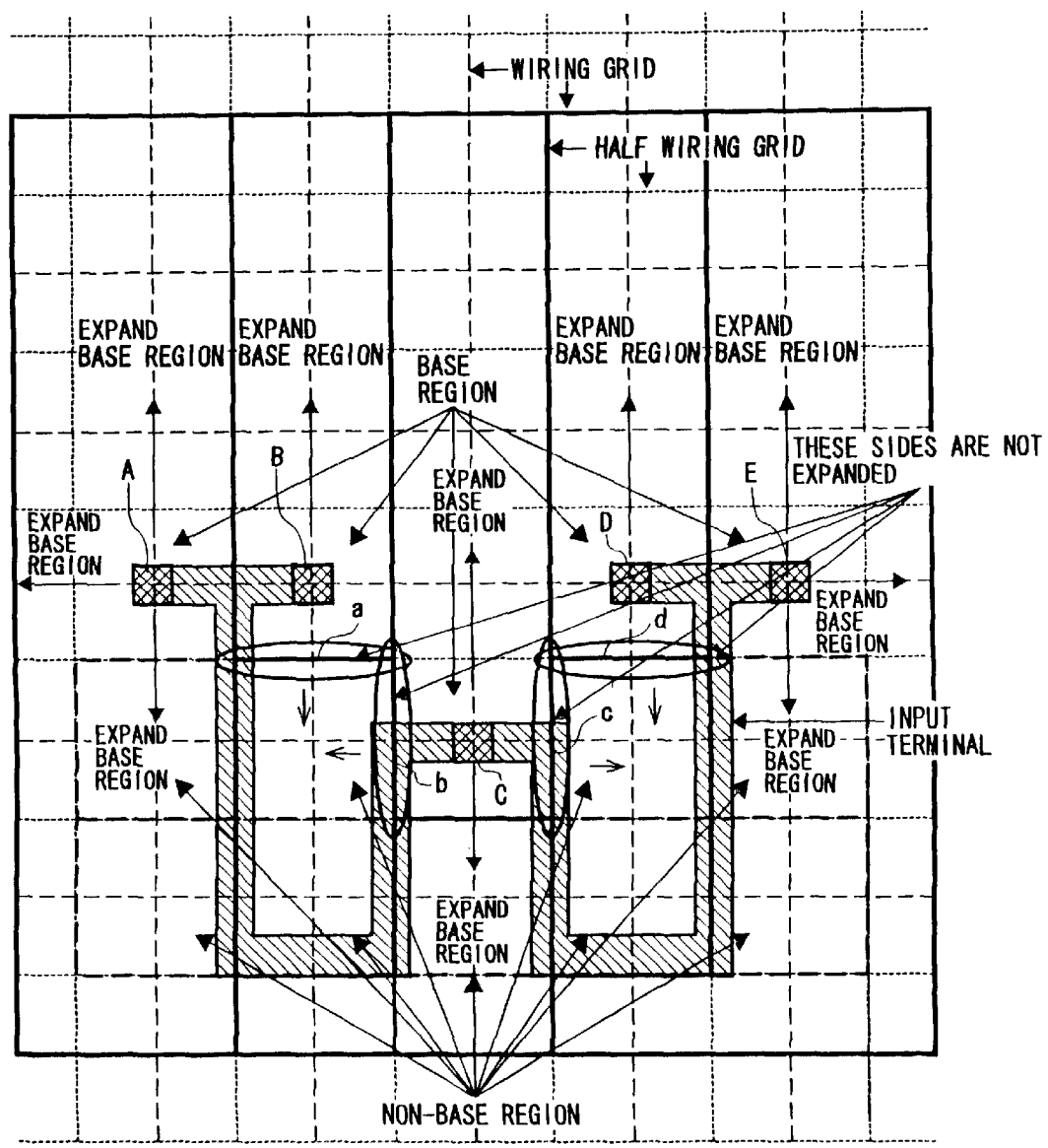
FIG. 8 is a drawing illustrating an expansion of a base region.

In the fourth processing, as shown in FIG. 8, atop side, a bottom side, a left side, and a right side of a base region which includes the above-noted interconnect terminal point are moved outward a small amount by the minimum design unit (for example 0.01 μm, if the minimum design unit is 0.01 μm), so as to expand the base region (Step S40). When doing this, if a top side of a base region overlap any one of the top, bottom, left, or right sides of another base region, the movement of the top side is stopped, and the movement of the remaining sides is continued, so as to expand the base region (Step S41, S42, S43). If a bottom side of a base region overlap any one of the top, bottom, left, or right sides of another base region, the movement of the bottom side is stopped, and the movement of the remaining sides is continued, so as to expand the base region. In the same manner, if a left side or a right side of a base region overlap any one of the top, bottom, left, or right sides of another base region, the movement of that side is stopped, and the movement of the remaining sides is continued, so as to expand the base region.

In FIG. 8, the side a of a base region containing the terminal information B is moved in the downward direction shown in the drawing, and the side b of the base region containing the terminal information C is moved in the leftward direction as shown in the drawing. In this case, however, because the base region containing the terminal information B and the base region containing the terminal information C overlap, the movement of the sides a and b is temporarily stopped.

In the same manner, the side c of a base region containing the terminal information C is moved in the rightward direction shown in the drawing, and the side d of the base region containing the terminal information D is moved in the downward direction as shown in the drawing. In this case, however, because the base region containing the terminal information C and the base region containing the terminal information D overlap, the movement of the sides c and d is temporarily stopped.

Figure 9:
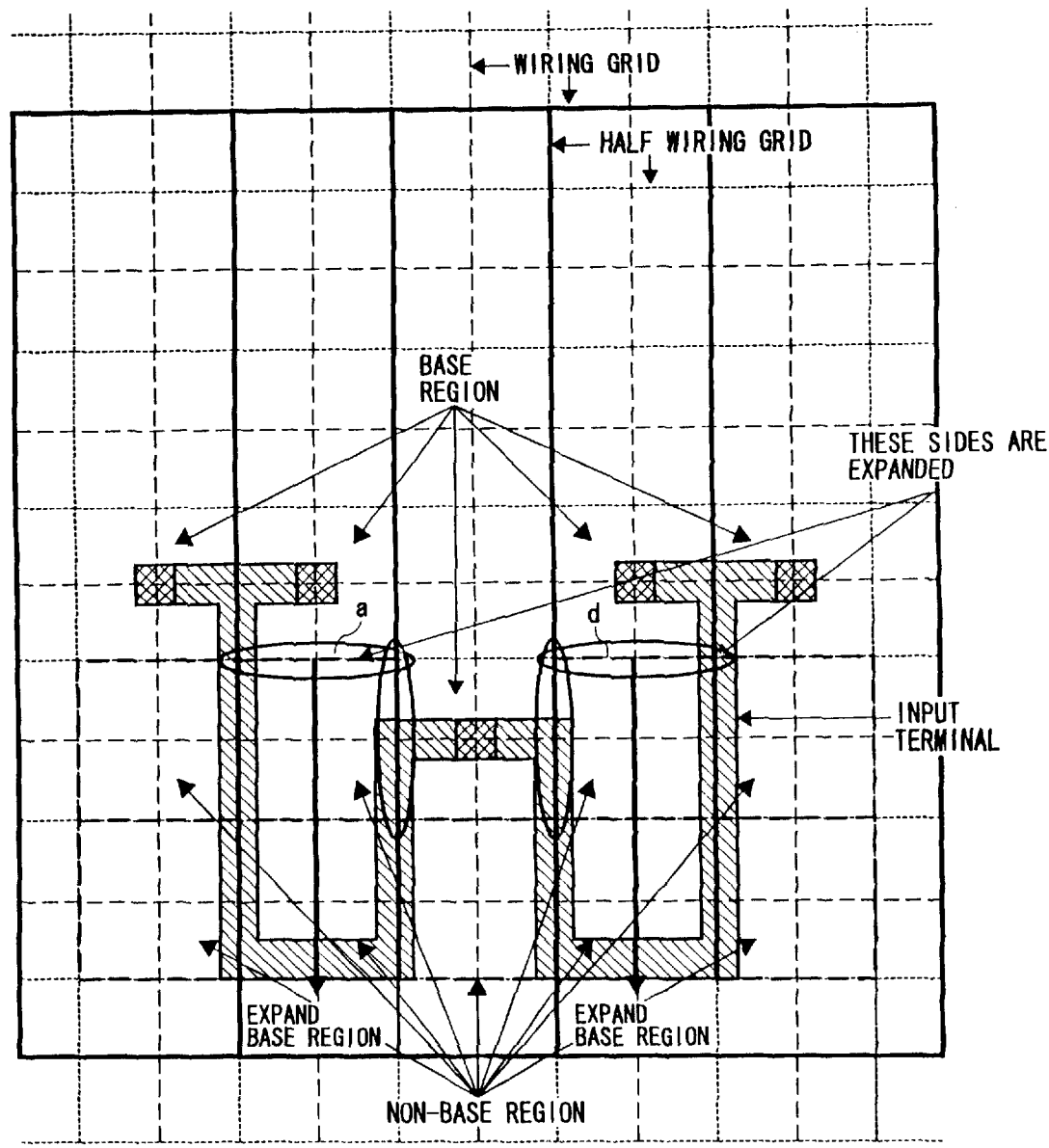
FIG. 9 is a drawing illustrating an expansion of a base region.

After the above-noted processing is completed, as shown in FIG. 9, sides which can be expanded are extracted from sides, movement of which are stopped because of overlapping, and if expansion is possible, the above-noted processing is done so as to perform region expansion. In this example, because the configuration is such that priority is given to movement in the upward and downward directions, the sides a and d move in the directions of the arrows in FIG. 9.

If the expansion range for a region is specified, expansion is done within the specified expansion range. Additionally, in the case in which range for allowable expansion is not specified, expansion of a region is done within the region of a functional block.

The above-described processing is repeated for all input/output terminal information.

Figure 10:
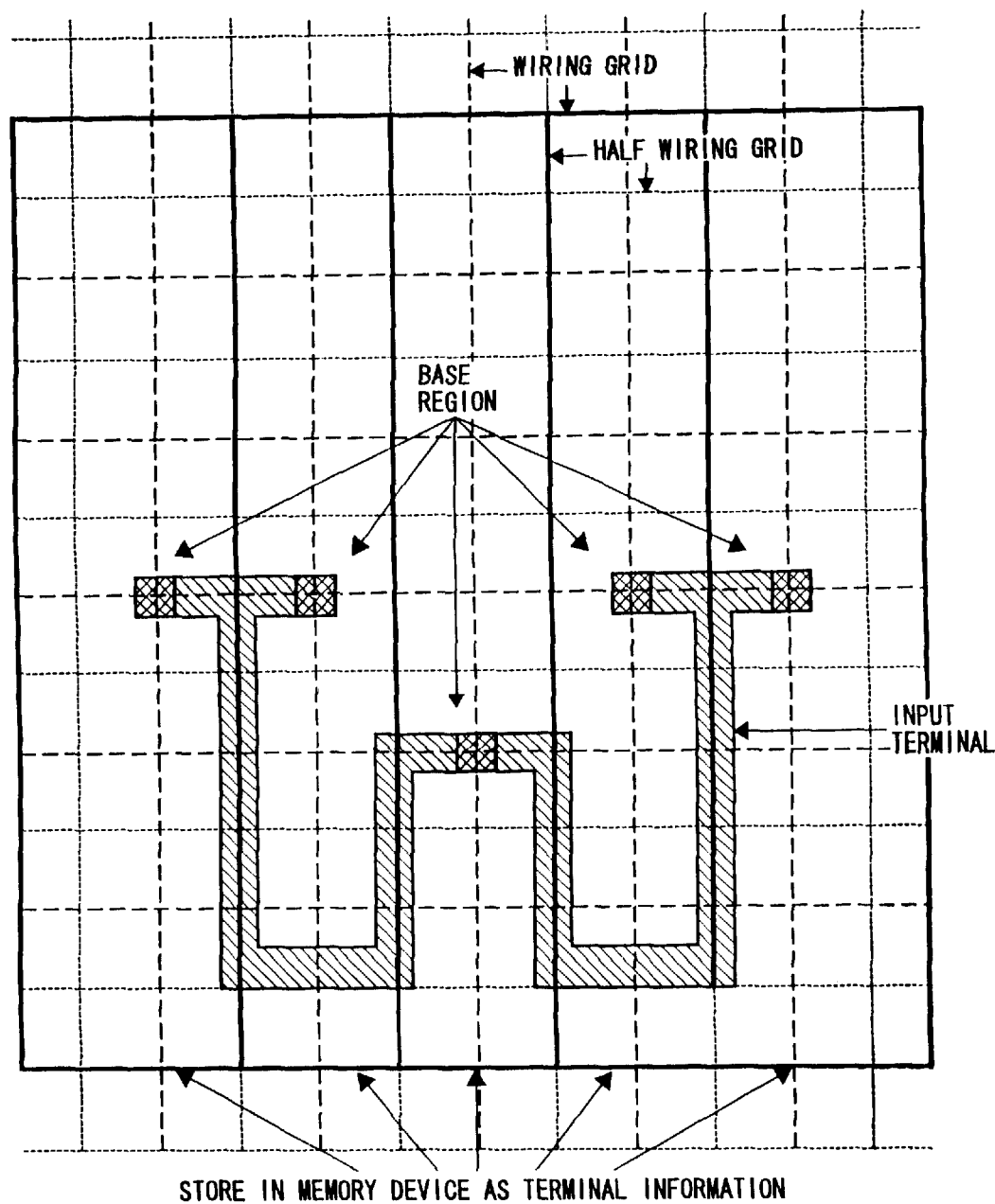
FIG. 10 is a drawing showing the condition in which functional block terminals according to the first embodiment are defined.
Figure 11A:
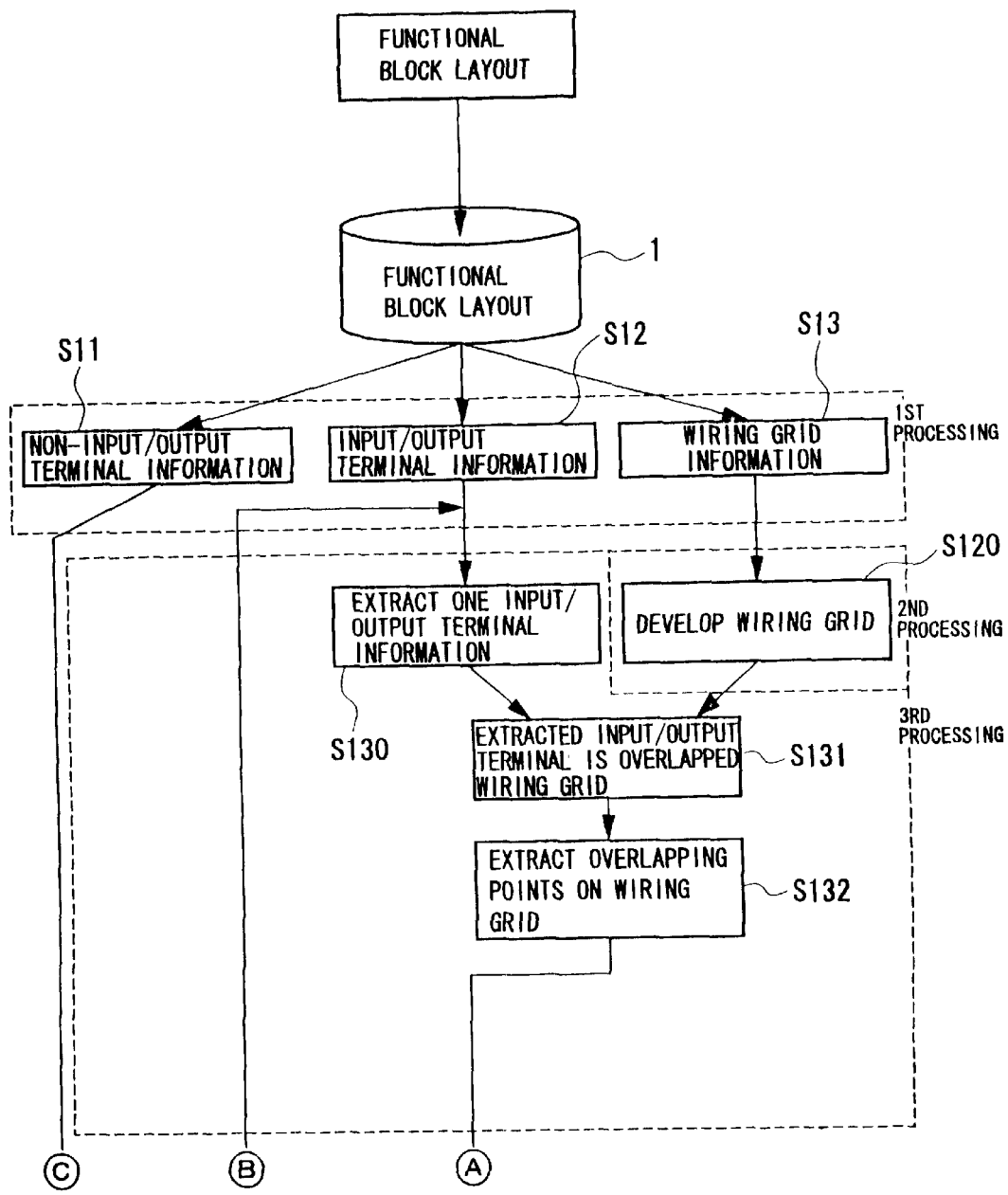
FIGS. 11(a) and 11(b) are flowcharts showing a second embodiment of the present invention.
Figure 11B:
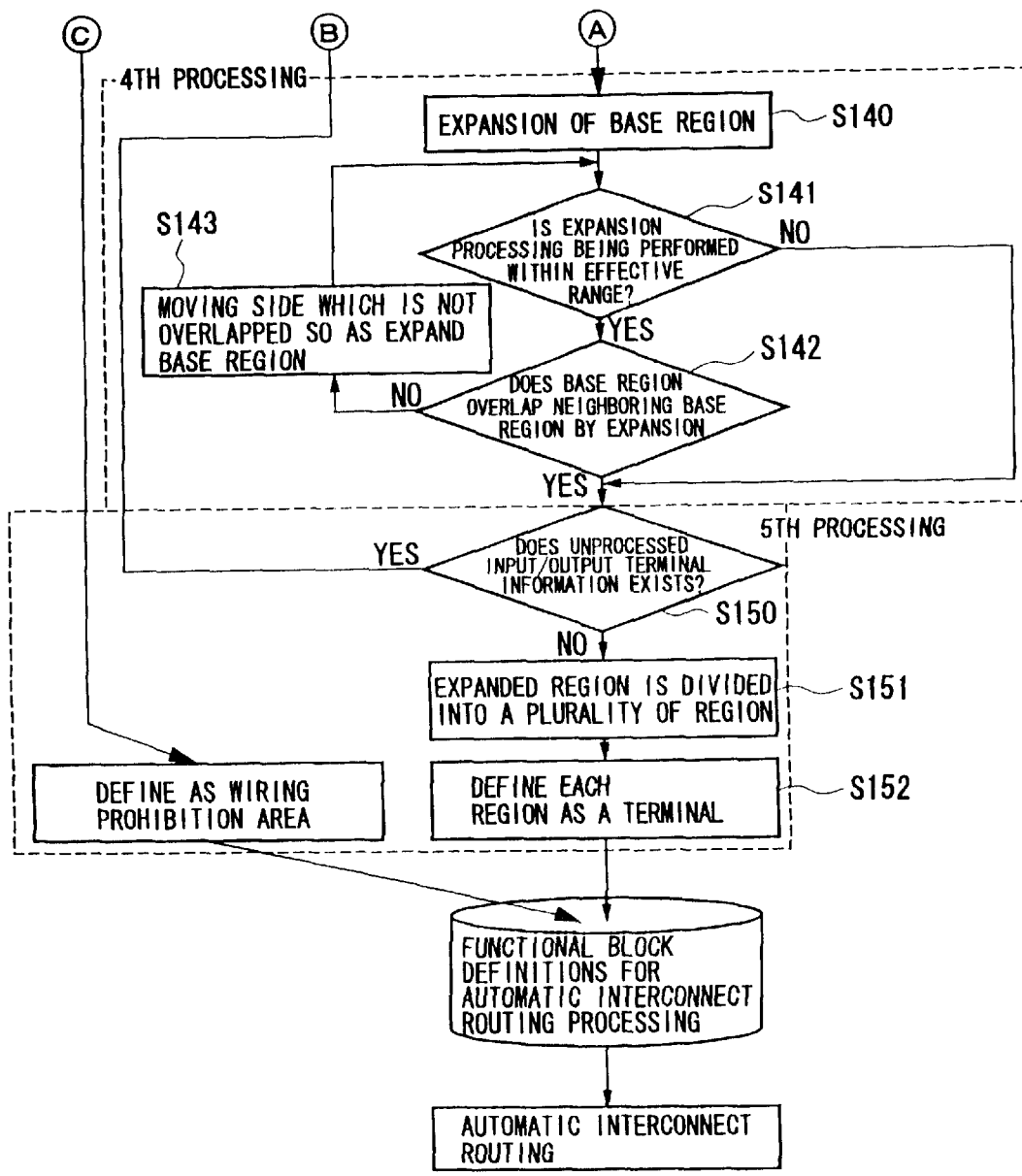

In the fifth processing, as shown in FIG. 10, after completing the fourth processing, a terminal information of the non-base region is combined with a terminal information of the base region (Step S50, S51), and this combined terminal information data being defined as a terminal (Step S52).

In the same manner, the remaining terminal information is extracted from the input/output terminal information stored in the internal memory device, and the third to the fifth processing are repeated, so as to process all of the input/output terminal information.

Thus, a first embodiment of the present invention has a process for reading in functional block layout information 1 of the semiconductor device from an external memory device 10, a process for separating the functional block layout information 1 into input/output terminal information (Step S12), non-input/output terminal information (Step S11), and wiring grid information (Step S13) for wiring grids g0, and storing the input/output terminal information, the non-input/output terminal information, and the wiring grid information in an internal memory device 20, a process for recalling wiring grid information stored in the internal memory device 20, setting auxiliary wiring grids g11–g14 at an intermediate point between the wiring grids g0, g0 adjacent each other in the X direction and Y direction, and storing the auxiliary wiring grid information including the auxiliary wiring grids in the internal memory device (Step S20), a process for recalling the input/output terminal information and the auxiliary wiring grids information stored in the internal memory device, and overlapping the terminal 100 and the auxiliary wiring grids g11–g14 (Step S31), a process for dividing the terminal 100 into a first region 21 and a second region 22 which are surrounded by the auxiliary wiring grids g11–g14 adjacent each other in X-direction and Y-direction so as to form a top side 31, a bottom side 32, a left side 33 and a right side 34 of the first region 21, the first region 21 including a terminal portion A (B, C, D, E), which is a part of the terminal 100, overlapped an intersection 200 of the wiring grids g0 in X-direction and Y-direction, the second region 22 not including the terminal portion overlapped the intersection 200 (Step S33–S34), a process for moving the top 31, bottom 32, left 33, and right sides 34 of the first region 21 outward so as to expand the first region 21, respectively, until each side comes into contact with or overlaps an adjacent first region (Step S41–S43), and a process for dividing the terminal 100 into a plurality of first regions 21 expanded by moving the sides 31–34, and storing the dividing information as the terminal units in the external memory device (Step S52).

Second Embodiment

The second embodiment is described below in further detail.

In the first processing of the second embodiment, functional block layout information is read in from an external memory device (not shown in the drawing), this information is divided into input/output terminal information, non-input/output terminal information, and wiring grid information, and these divided data are stored in an internal memory device.

Figure 12:
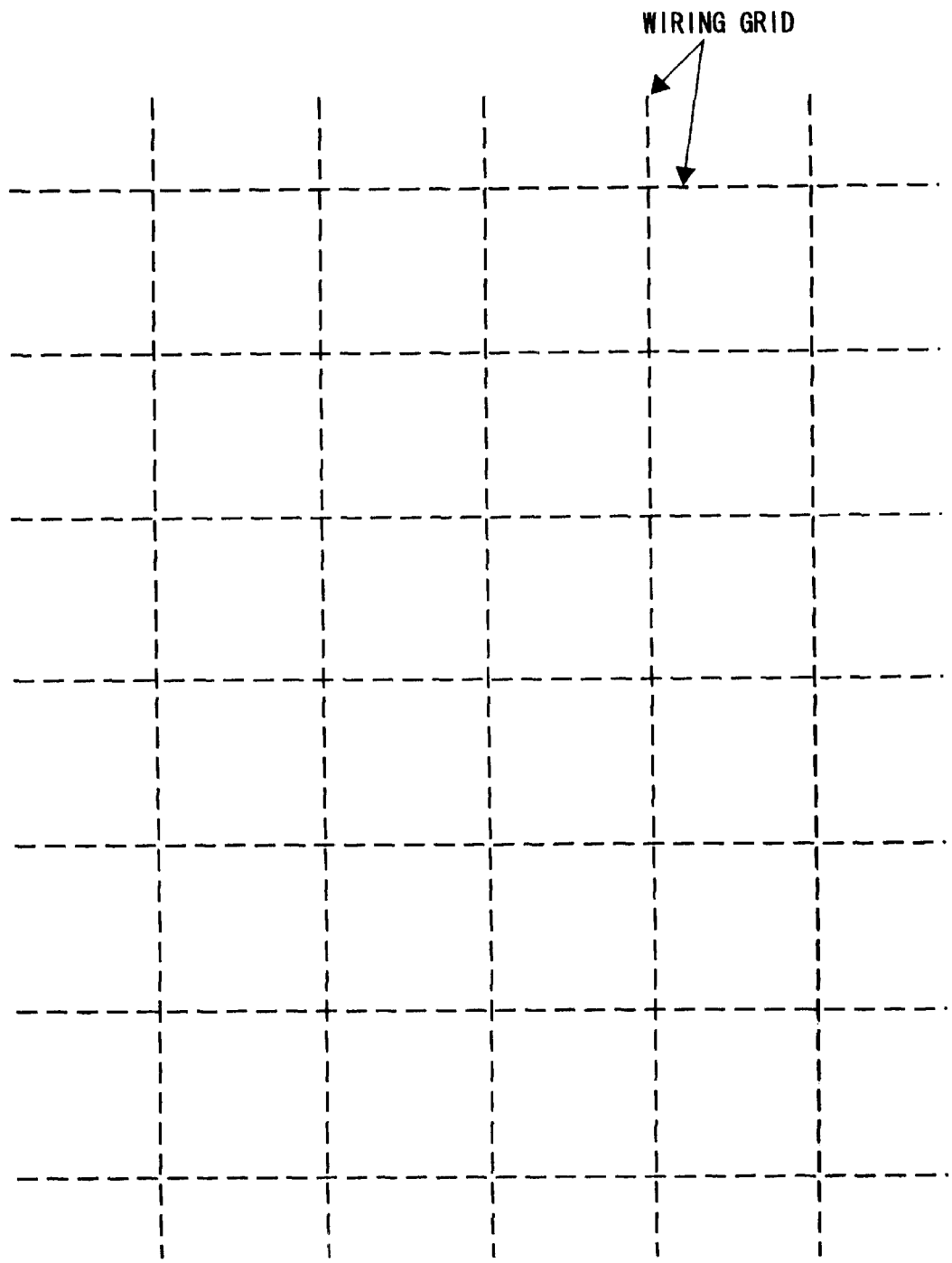
FIG. 12 is a drawing showing wiring grids in the second embodiment of the present invention.

In the second processing, wiring grid information stored in the internal memory device is recalled, and wiring grid is displayed as shown in FIG.12 (Step S120).

Figure 13:
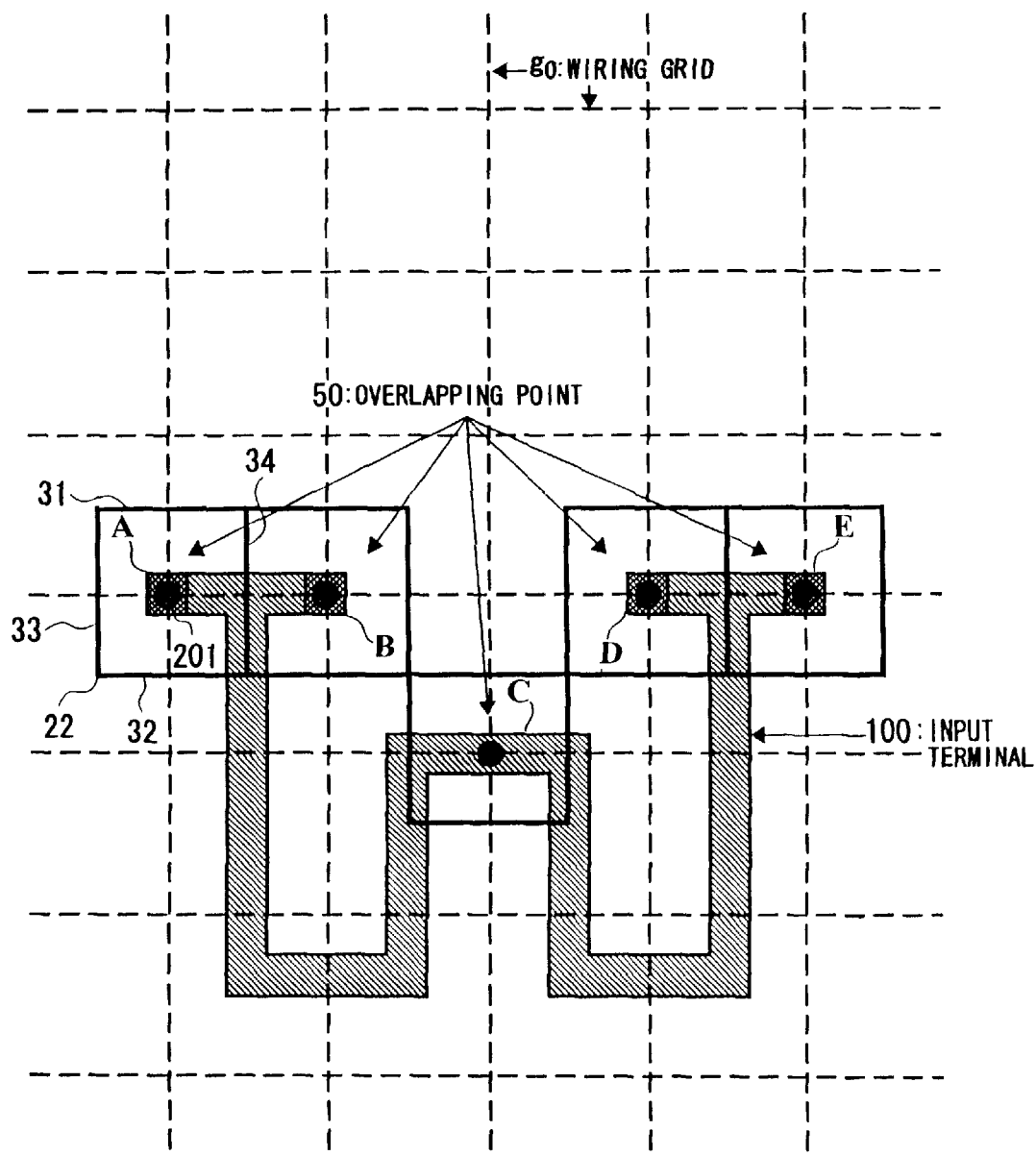
FIG. 13 is a drawing showing the second embodiment of the present invention in which wiring is overlapped onto wiring grids.

In the third processing, one terminal information selected from the input/output terminal information stored in the internal memory device and wiring grid information stored by the second processing are recalled from the internal memory device, and the selected terminal information are overlapped the wiring grid (Step S131). Then overlapping points of wiring grid intersection and input/output terminal information are extracted and stored in the internal memory device (Step S132). In FIG.13, points A, B, C, D, and E are overlapping points.

Figure 14:
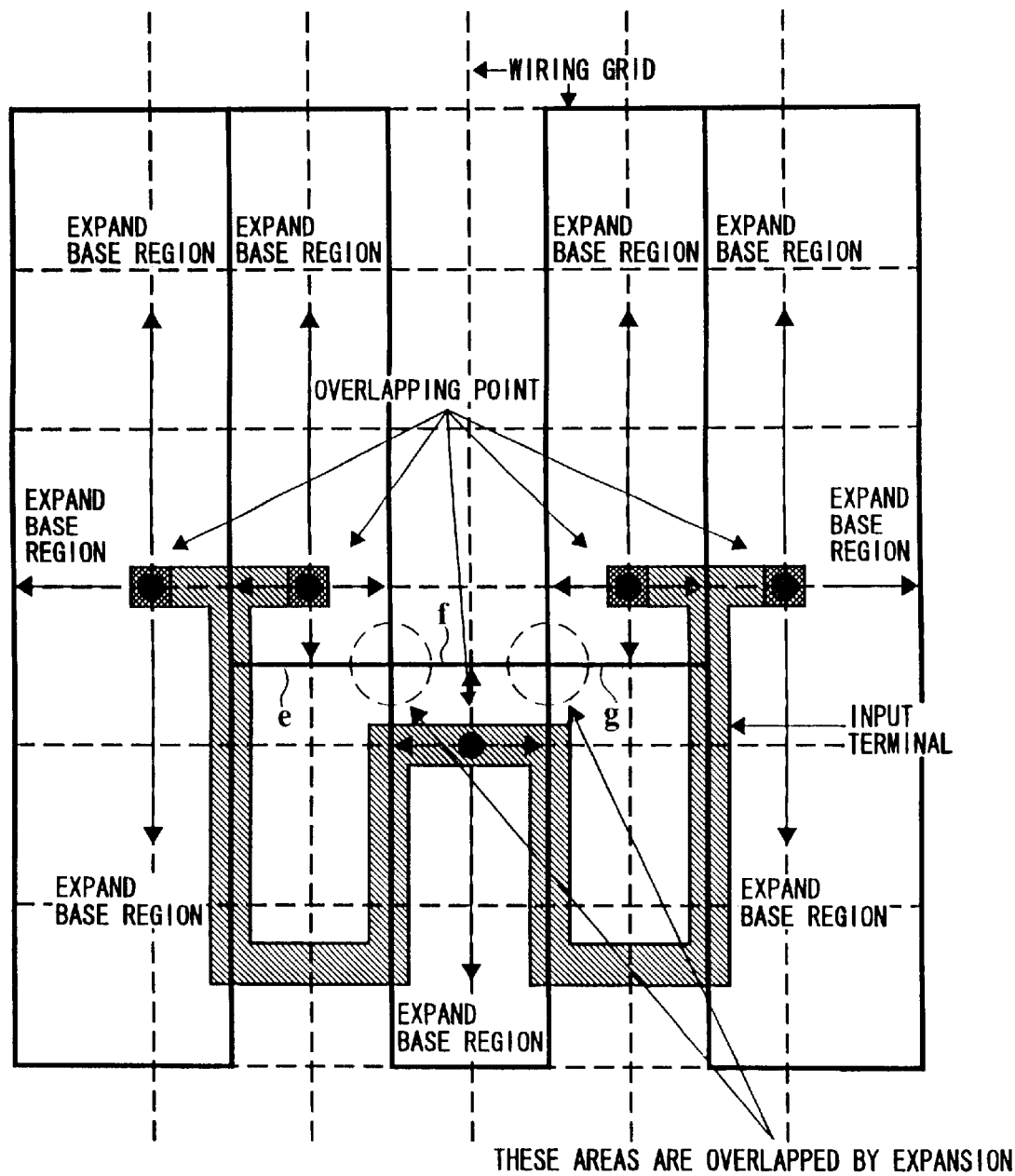
FIG. 14 is a drawing illustrating an expansion of a base region.

In the fourth processing, as shown in FIG. 14, a region including the overlapping points such as points A, B, C, D, and E are set as a base region, and top sides, bottom sides, left sides, and right sides of these regions are moved in the upward, downward, leftward, and rightward directions, respectively, so as to gradually expand the region (Step S140). In this case, the expansion processing by movement of a top side, a bottom side, a left side, and a right side is done in the minimum design unit (for example 0.01 μm, if the minimum design unit is 0.01 μm). In this case, same manner as in the first embodiment, the expansion processing is performed until there is overlap with another region, and in the case in which there is overlap, the expansion processing in that direction is stopped, with expansion in the remaining directions being continued (Step S141, S142, S143).

Similar to the case of the first embodiment, in the case in which the range of allowable expansion is set, expansion is repeated within the set expandable region. If the range of allowable expansion is not set, the expansion processing of the base region is repeated within the functional block region.

After the above-noted processing is completed, as shown in FIG. 14, sides which can be expanded are extracted from sides, movement of which are stopped because of overlapping, and if expansion is possible, the above-noted processing is done so as to perform region expansion. In FIG. 14, the sides e and g are moved downward, and the side f is moved upward, and then the region expansion processing is ended.

Figure 15:
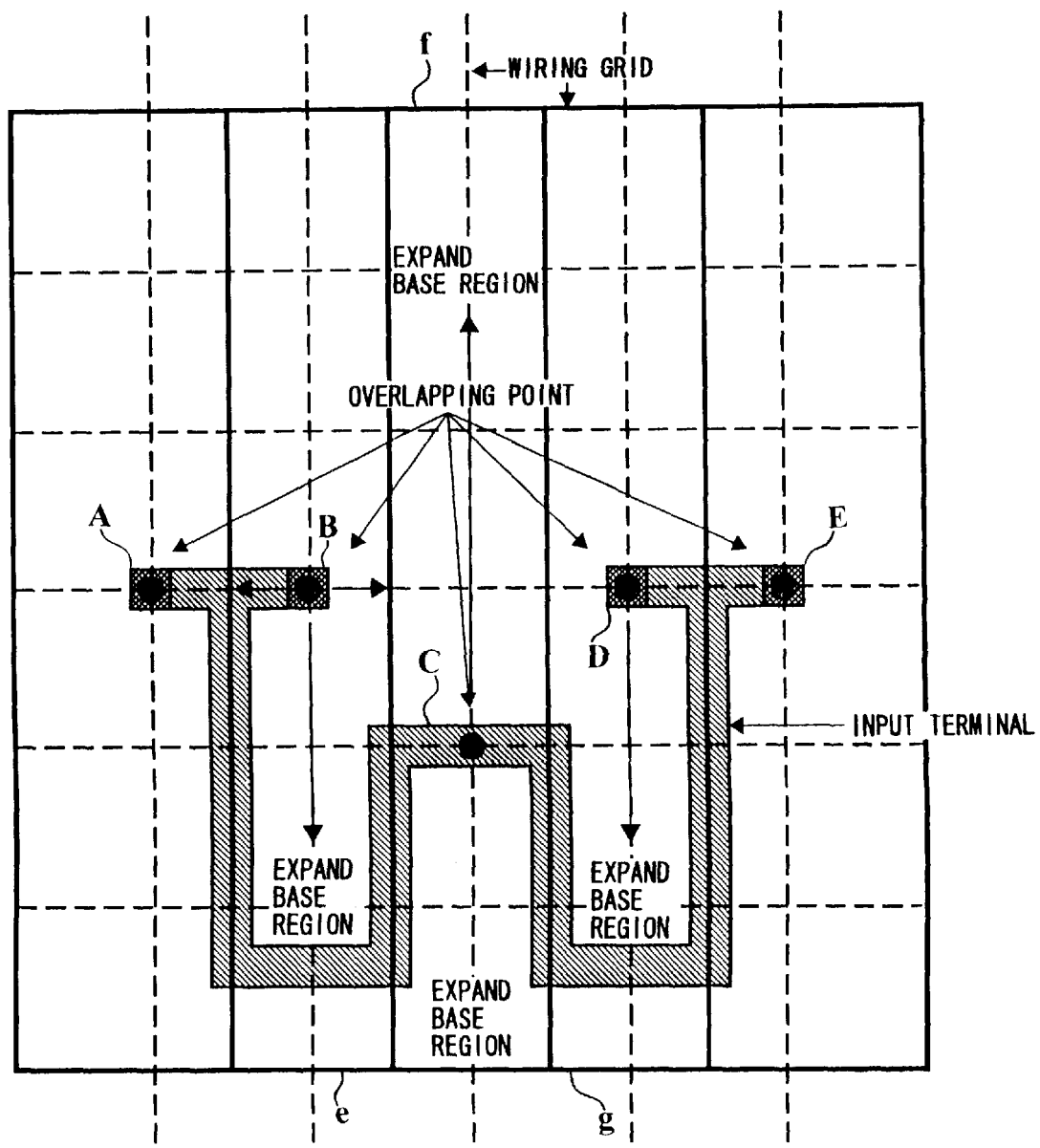
FIG. 15 is a drawing illustrating an expansion of a base region.

In the fifth processing, as shown in FIG. 15, each region defined as expanded base region in the fourth processing is stored in the internal memory device (Step S151, S152).

In the same manner, the remaining terminal information is extracted from the input/output terminal information stored in the internal memory device, and the third to the fifth processing are repeated, so as to process all of the input/output terminal information.

Thus, the second embodiment of the present invention has a process for reading in functional block layout information 1 of the semiconductor device from an external memory device, a process for separating the functional block layout information into input/output terminal information, non-input/output terminal information, and wiring grid information for wiring grids, and storing the input/output terminal information, the non-input/output terminal information, and the wiring grid information in an internal memory device (Step S11–S13), a process for recalling the input-output terminal information and the wiring grids information stored in the internal memory device, and overlapping the terminal and the wiring grids (Step S30, S120, S131), a process for extracting a terminal portion 50, which is a part of the terminal 100, overlapped an intersection 201 of the wiring grids g0 in X-direction and Y-direction (Step S132), a process for forming a terminal region 22 which includes the terminal portion 50, and forming a top side 31, a bottom side 32, a left side 33 and a right side 34 so as to surround the terminal region 22, a process for moving the top 31, bottom 32, left 33, and right 34 sides of the terminal region 22 outward so as to expand the terminal region 22, respectively, until each side comes into contact with or overlaps an adjacent terminal region (Step S140–S143), and a process for dividing the terminal 100 into a plurality of terminal regions expanded by moving the sides, and storing the dividing information as the terminal units in the external memory device (Step S152).

In the present invention, as described in detail above, it is possible to prevent missing settings and erroneous settings in the design process, thereby improving the efficiency of the design process.

An additional effect achieved by the present invention is that it is possible to use a conventional automatic interconnect routing tool without adding an extra processing or an extra memory region.

What is claimed is:

1. A method for dividing a terminal into a plurality of terminal units in automatic interconnect routing processing in a semiconductor device, said method comprising:

reading in functional block layout information of said semiconductor device from an external memory device;

separating said functional block layout information into input/output terminal information, non-input/output terminal information, and wiring grid information for wiring grids, and storing said input/output terminal information, said non-input/output terminal information, and said wiring grid information in an internal memory device;

recalling wiring grid information stored in said internal memory device, setting auxiliary wiring grids at an intermediate point between said wiring grids adjacently arranged to each other in the X direction and at an intermediate point between said wiring grids adjacently arranged to each other in Y direction, and storing said auxiliary wiring grid information including said auxiliary wiring grids in said internal memory device;

recalling said input/output terminal information and said auxiliary wiring grids information stored in said internal memory device, and overlapping said terminal involved in said input/output terminal information and said auxiliary wiring grids;

dividing a wiring area of said semiconductor device into a first region and a second region, wherein said first region comprises an area formed by being surrounded with said auxiliary wiring grids adjacently arranged to each other in X-direction and being adjacently arranged to each other in Y-direction and including said terminal provided on a crossing point at which said auxiliary wiring grid in X-direction and in Y-direction are intercrossed to each other and said second region which does not include said terminal over said crossing point so as to define a top side, a bottom side, a left side and a right side of said first region;

moving said top, bottom, left, and right sides of said first region outward so as to expand said first region, respectively, until each side comes into contact with or overlaps an adjacent first region; and dividing said terminal into a plurality of first regions expanded by moving said sides, and storing said dividing information as said terminal units in said external memory device.

2. A method for dividing a terminal into a plurality of terminal units in automatic interconnect routing processing in a semiconductor device, said method comprising:

reading in functional block layout information of said semiconductor device from an external memory device;

separating said functional block layout information into input/output terminal information, non-input/output terminal information, and wiring grid information for wiring grids, and storing said input/output terminal information, said non/input/output terminal information, and said wiring grid information in an internal memory device;

recalling wiring grid information stored in said internal memory device, setting auxiliary wiring grids at an intermediate point between said wiring grids adjacently arranged to each other in the X direction and at an intermediate point between said wiring grids adjacently arranged to each other in Y direction, and storing said auxiliary wiring grid information including said auxiliary wiring grids in said internal memory device;

recalling said input/output terminal information and said auxiliary wiring grids information stored in said internal memory device, and overlapping said terminal and said auxiliary wiring grids;

dividing a wiring area of said semiconductor device into a first region and a second region, wherein said first region comprises an area formed by being sur rounded with said auxiliary wiring grids adjacently arranged to each other in X-direction and being adjacently arranged to each other in Y-direction and including said terminal provided on a crossing point at which said auxiliary wiring grid in X-direction and in Y-direction are intercrossed to each other and said second region which does not include said terminal over said crossing point so as to define a top side, a bottom side, a left side and a right side of said first region;

moving said top, bottom, left, and right sides of said first region outward so as to expand said first region, respectively, until each side comes into contact with or overlaps an adjacent first region; and dividing said terminal into a plurality of first regions expanded by moving said sides, and storing said dividing information as said terminal units in said external memory device.

3. A method for dividing a terminal into a plurality of terminal units in automatic interconnect routing processing in a semiconductor device, said method comprising:

reading in functional block layout information of said semiconductor device from an external memory device;

separating said functional block layout information into input/output terminal information, non-input/output terminal information, and wiring grid information for wiring grids, and storing said input/output terminal information, said non-input/output terminal information, and said wiring grid information in an internal memory device;

recalling said input/output terminal information and said wiring grids information stored in said internal memory device, and overlapping said terminal and said wiring grids;

extracting a terminal portion, which is a part of said terminal, overlapping an intersection of said wiring grids in X-direction and Y-direction;

forming a terminal region which includes said terminal portion, and forming a top side, a bottom side, a left side and a right side so as to surround said terminal region;

moving said top, bottom, left, and right sides of said terminal region outward so as to expand said terminal region, respectively, until each side comes into contact with or overlaps an adjacent terminal region; and dividing said terminal into a plurality of terminal regions expanded by moving said sides, and storing said dividing information as said terminal units in said external memory device.

4. A method for dividing a terminal into a plurality of terminal units in automatic interconnect routing processing in a semiconductor device, said method comprising:

reading in functional block layout information of said semiconductor device from an external memory device;

separating said functional block layout information into input/output terminal information, non-input/output terminal information, and wiring grid information for wiring grids, and storing said input/output terminal information, said non-input/output terminal information, and said wiring grid information in an internal memory device;

recalling said input/output terminal information and said wiring grids information stored in said internal memory device, and overlapping said terminal and said wiring grids;

extracting a terminal portion, which is a part of said terminal, overlapping an intersection of said wiring grids in X-direction and Y-direction;

forming a terminal region which includes said terminal portion, and forming a top side, a bottom side, a left side and a right side so as to surround said terminal region;

moving said top, bottom, left, and right sides of said terminal region outward so as to expand said terminal region, respectively, until each side comes into contact with or overlaps an adjacent terminal region; and dividing said terminal into a plurality of terminal regions expanded by moving said sides, and storing said dividing information as said terminal units in said external memory device.

5. An automatic interconnect routing processor for a semiconductor device, comprising:

a first means for reading in functional block layout information of said semiconductor device from an external memory device;

a second means for separating said functional block layout information into input/output terminal information, non-input/output terminal information, and wiring grid information for wiring grids, and storing said input/output terminal information, said non-input/output terminal information, and said wiring grid information in an internal memory device;

a third means for recalling wiring grid information stored in said internal memory device, setting auxiliary wiring grids at an intermediate point between said wiring grids adjacently arranged to each other in the X direction and at an intermediate point between said wiring grids adjacently arranged to each other in Y direction, and storing said auxiliary wiring grid information including said auxiliary wiring grids in said internal memory device;

a fourth means for recalling said input/output terminal information and said auxiliary wiring grids information stored in said internal memory device, and overlapping said terminal and said auxiliary wiring grids;

a fifth means for dividing a wiring area of said semiconductor device into a first region and a second region, wherein said first region comprises an area formed by being surrounded with said auxiliary wiring grids adjacently arranged to each other in X-direction and being adjacently arranged to each other in Y-direction and including said terminal provided on a crossing point at which said auxiliary wiring grid in X-direction and in Y-direction are intercrossed to each other and said second region which does not include said terminal over said crossing point so as to define a top side, a bottom side, a left side and a right side of said first region;

a sixth means for moving said top, bottom, left, and right sides of said first region outward so as to expand said first region, respectively, until each side comes into contact with or overlaps an adjacent first region; and a seventh means for dividing said terminal into a plurality of first regions expanded by moving said sides, and storing said dividing information as said terminal units in said external memory device.

6. An automatic interconnect routing processor for a semiconductor device, comprising:

a first means for reading in functional block layout information of said semiconductor device from an external memory device;

a second means for separating said functional block layout information into input/output terminal information, non-input/output terminal information, and wiring grid information for wiring grids, and storing said input/output terminal information, said non-input/output terminal information, and said wiring grid information in an internal memory device;

a third means for recalling wiring grid information stored in said internal memory device, setting auxiliary wiring grids at an intermediate point between said wiring grids adjacently arranged to each other in the X direction and at an intermediate point between said wiring grids adjacently arranged to each other in Y direction, and storing said auxiliary wiring grid information including said auxiliary wiring grids in said internal memory device;

a fourth means for recalling said input/output terminal information and said auxiliary wiring grids information stored in said internal memory device, and overlapping said terminal and said auxiliary wiring grids;

a fifth means for dividing a wiring area of said semiconductor device into a first region and a second region, wherein said first region comprises an area formed by being surrounded with said auxiliary wiring grids adjacently arranged to each other in X-direction and being adjacently arranged to each other in Y-direction and including said terminal provided on a crossing point at which said auxiliary wiring grid in X-direction and in Y-direction are intercrossed to each other and said second region which does not include said terminal over said crossing point so as to define a top side, a bottom side, a left side and a right side of said first region;

a sixth means for moving said top, bottom, left, and right sides of said first region outward so as to expand said first region, respectively, until each side comes into contact with or overlaps an adjacent first region; and a seventh means for dividing said terminal into a plurality of first regions expanded by moving said sides, and storing said dividing information as said terminal units in said external memory device.

7. An automatic interconnect routing processor for a semiconductor device, comprising:

a first means for reading in functional block layout information of said semiconductor device from an external memory device;

a second means for separating said functional block layout information into input/output terminal information, non-input/output terminal information, and wiring grid information for wiring grids, and storing said input/output terminal information, said non-input/output terminal information, and said wiring grid information in an internal memory device;

a third means for recalling said input/output terminal information and said wiring grids information stored in said internal memory device, and overlapping said terminal and said wiring grids;

a fourth means for extracting a terminal portion, which is a part of said terminal, overlapping an intersection of said wiring grids in X-direction and Y-direction, a fifth means for forming a terminal region which includes said terminal portion, and forming a top side, a bottom side, a left side and a right side so as to surround said terminal region;

a sixth means for moving said top, bottom, left, and right sides of said terminal region outward so as to expand said terminal region, respectively, until each side comes into contact with or overlaps an adjacent terminal region; and a seventh means for dividing said terminal into a plurality of terminal regions expanded by moving said sides, and storing said dividing information as said terminal units in said external memory device.

8. An automatic interconnect routing processor for a semiconductor device, comprising:

a first means for reading in functional block layout information of said semiconductor device from an external memory device;

a second means for separating said functional block layout information into input/output terminal information, non-input/output terminal information, and wiring grid information for wiring grids, and storing said input/output terminal information, said non-input/output terminal information, and said wiring grid information in an internal memory device;

a third means for recalling said input/output terminal information and said wiring grids information stored in said internal memory device, and overlapping said terminal and said wiring grids;

a fourth means for extracting a terminal portion, which is a part of said terminal, overlapped on an intersection of said wiring grids in X-direction and Y-direction;

a fifth means for forming a terminal region which includes said terminal portion, and forming a top side, a bottom side, a left side and a right side so as to surround said terminal region;

a sixth means for moving said top, bottom, left, and right sides of said terminal region outward so as to expand said terminal region, respectively, until each side comes into contact with or overlaps an adjacent terminal region; and a seventh means for dividing said terminal into a plurality of terminal regions expanded by moving said sides, and storing said dividing information as said terminal units in said external memory device.

9. A signal-bearing medium tangibly embodying a program of machine-readable instructions executable by a digital processing apparatus to perform a method for dividing a terminal into a plurality of terminal units in automatic interconnect routing processing in a semiconductor device, said method comprising:

reading in functional block layout information of said semiconductor device from an external memory device;

separating said functional block layout information into input/output terminal information, non-input/output terminal information, and wiring grid information for wiring grids, and storing said input/output terminal information, said non-input/output terminal information, and said wiring grid information in an internal memory device;

recalling wiring grid information stored in said internal memory device, setting auxiliary wiring grids at an intermediate point between said wiring grids adjacently arranged to each other in the X direction and at an intermediate point between said wiring grids adjacently arranged to each other in Y direction, and storing said auxiliary wiring grid information including said auxiliary wiring grids in said internal memory device;

recalling said input/output terminal information and said auxiliary wiring grids information stored in said internal memory device, and overlapping said terminal and said auxiliary wiring grids;

dividing a wiring area of said semiconductor device into a first region and a second region wherein said first region comprises an area formed by being surrounded with said auxiliary wiring grids adjacently arranged to each other in X-direction and being adjacently arranged to each other in Y-direction and including said terminal provided on a crossing point at which said auxiliary wiring grid in X-direction and in Y-direction are intercrossed to each other and said second region which does no include said terminal over said crossing point so as to define a top side, a bottom side, a left side and a right side of said first region;

moving said top, bottom, left, and right sides of said first region outward so as to expand said first region, respectively, until each side comes into contact with or overlaps and an adjacent first region; and dividing said terminal into a plurality of first regions expanded by moving said sides, and storing said dividing information as said terminal units in said external memory device.

10. A signal-bearing medium tangibly embodying a program of machine-readable instructions executable by a digital processing apparatus to perform a method for dividing a terminal into a plurality of terminal units in automatic interconnect routing processing in a semiconductor device, said method comprising:

reading in functional block layout information of said semiconductor device from an external memory device;

separating said functional block layout information into input/output terminal information, non-input/output terminal information, and wiring grid information for wiring grids, and storing said input/output terminal information, said non-input/output terminal information, and said wiring grid information in an internal memory device;

recalling wiring grid information stored in said internal memory device, setting auxiliary wiring grids at an intermediate point between said wiring grids adjacently arranged to each other in the X direction and at an intermediate point between said wiring grids adjacently arranged to each other in Y direction, and storing said auxiliary wiring grid information including said auxiliary wiring grids in said internal memory device;

recalling said input/output terminal information and said auxiliary wiring grids information stored in said internal memory device, and overlapping said terminal and said auxiliary wiring grids;

dividing a wiring area of said semiconductor device into a first region and a second region, wherein said first region comprises an area formed by being surrounded with said auxiliary wiring grids adjacently arranged to each other in X-direction and being adjacently arranged to each other in Y-direction and including said terminal provided on a crossing point at which said auxiliary wiring grid in X-direction and in Y-direction are intercrossed to each other and said second region which does not include said terminal over said crossing point so as to define a top side, a bottom side, a left side and a right side of said first region;

moving said top, bottom, left, and right sides of said first region outward so as to expand said first region, respectively, until each side comes into contact with or overlaps an adjacent first region; and dividing said terminal into a plurality of first regions expanded by moving said sides, and storing said dividing information as said terminal units in said external memory device.

11. A signal-bearing medium tangibly embodying a program of machine-readable instructions executable by a digital processing apparatus to perform a method for dividing a terminal into a plurality of terminal units in automatic interconnect routing processing in a semiconductor device, said method comprising:

reading in functional block layout information of said semiconductor device from an external memory device;

separating said functional block layout information into input/output terminal information, non-input/output terminal information, and wiring grid information for wiring grids, and storing said input/output terminal information, said non-input/output terminal information, and said wiring grid information in an internal memory device;

recalling said input/output terminal information and said wiring grids information stored in said internal memory device, and overlapping said terminal and said wiring grids;

extracting a terminal portion, which is a part of said terminal, overlapped on an intersection of said wiring grids in X-direction and Y-direction;

forming a terminal region which includes said terminal portion, and forming a top side, a bottom side, a left side and a right side so as to surround said terminal region;

moving said top, bottom, left, and right sides of said terminal region outward so as to expand said terminal region, respectively, until each side comes into contact with or overlaps an adjacent terminal region; and dividing said terminal into a plurality of terminal regions expanded by moving said sides, and storing said dividing information as said terminal units in said external memory device.

12. A signal-beating medium tangibly embodying a program of machine-readable instructions executable by a digital processing apparatus to perform a method for dividing a terminal into a plurality of terminal units in automatic interconnect routing processing in a semiconductor device, said method comprising:

reading in functional block layout information of said semiconductor device from an external memory device;

separating said functional block layout information into input/output terminal information, non-input/output terminal information, and wiring grid information for wiring grids, and storing said input/output terminal information, said non-input/output terminal information, and said wiring grid information in an internal memory device;

recalling said input/output terminal information and said wiring grids information stored in said internal memory device, and overlapping said terminal and said wiring grids;

extracting a terminal portion, which is a part of said terminal, overlapped on an intersection of said wiring grids in X-direction and Y-direction;, forming a terminal region which includes said terminal portion, and forming a top side, a bottom side, a left side and a right side so as to surround said terminal region-, moving said top, bottom, left, and right sides of said terminal region outward so as to expand said terminal region, respectively, until each side comes into contact with or overlaps an adjacent terminal region; and dividing said terminal into a plurality of terminal regions expanded by moving said sides, and storing said dividing information as said terminal u nits in said external memory device.

13. A method of dividing a terminal into a plurality of terminal units in automatic interconnect routing processing for a semiconductor device, said method comprising:

separating a functional block layout information of said semiconductor device into input/output terminal information;

extracting terminal locations from said input/output terminal information;

forming a terminal region surrounding each said terminals and expanding each said terminal region outward until said terminal region contacts an adjacent terminal region.

14. The method of claim 13, further comprising:

reading in said function block layout information from an external memory device.

15. The method of claim 13, wherein said expanding comprises a stepwise expanding.

16. A method of preventing setting errors in an automated integrated circuit automatic interconnect routing processing, said method comprising:

- separating a functional block layout information of an integrated circuit design into input/output terminal information;
- extracting terminal portions from said input/output terminal information;
- forming a terminal region surrounding each said terminal portion; and
- expanding each said terminal region outward until said terminal region contacts an adjacent terminal region, wherein each said expanded terminal region defines an enlarged region in which said automated interconnect routing processing is capable of interconnecting to a terminal.

17. The method of claim 16, further comprising:

reading in said function block layout information from an external memory device.

18. The method of claim 16, wherein said expanding comprises a stepwise expanding.

\* \* \* \* \*